United States Patent
Kanno et al.

(10) Patent No.: US 7,796,429 B2
(45) Date of Patent: Sep. 14, 2010

(54) MEMORY CONTROLLER CONTROLLING SEMICONDUCTOR STORAGE DEVICE AND SEMICONDUCTOR DEVICE

(75) Inventors: Shinichi Kanno, Tokyo (JP); Yosuke Kuroda, Kawasaki (JP); Toshio Shirakihara, Yokohama (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 180 days.

(21) Appl. No.: 12/039,254

(22) Filed: Feb. 28, 2008

(65) Prior Publication Data
US 2008/0205145 A1  Aug. 28, 2008

(30) Foreign Application Priority Data
Feb. 28, 2007  (JP) .............................. 2007-050390

(51) Int. Cl.
*G11C 16/06* (2006.01)
(52) U.S. Cl. .............................. 365/185.03; 365/185.05
(58) Field of Classification Search ........................ None
See application file for complete search history.

(56) References Cited

U.S. PATENT DOCUMENTS

| | | | |
|---|---|---|---|
| 6,222,762 B1 * | 4/2001 | Guterman et al. ....... | 365/185.03 |
| 6,279,133 B1 | 8/2001 | Vafai et al. ................ | 714/763 |
| 6,728,825 B1 * | 4/2004 | Norman .................... | 711/103 |
| 7,126,850 B2 * | 10/2006 | Tatsukawa et al. ...... | 365/185.03 |
| 7,330,373 B2 * | 2/2008 | Lee et al. ................. | 365/185.19 |
| 7,359,249 B2 * | 4/2008 | Urabe et al. ............. | 365/185.23 |
| 2002/0159285 A1 | 10/2002 | Morley et al. ............ | 365/97 |
| 2006/0181934 A1 * | 8/2006 | Shappir et al. ......... | 365/185.33 |
| 2007/0130496 A1 | 6/2007 | Kanno ....................... | 714/763 |
| 2007/0174740 A1 | 7/2007 | Kanno ........................ | 714/54 |

FOREIGN PATENT DOCUMENTS

| | | |
|---|---|---|
| JP | 6076586 | 3/1994 |
| JP | 7-334991 | 12/1995 |
| JP | 8-50562 | 2/1996 |
| JP | 2004-046985 A | 2/2004 |
| JP | 2006-139884 A | 6/2006 |
| JP | 2006-228407 A | 8/2006 |

OTHER PUBLICATIONS

Official action dated Mar. 3, 2009 for corresponding Japanese application No. 2007-050390.

(Continued)

*Primary Examiner*—Tan T. Nguyen
(74) *Attorney, Agent, or Firm*—Ohlandt, Greeley, Ruggiero & Perle, L.L.P.

(57) ABSTRACT

A memory controller controls a semiconductor storage device including nonvolatile memory cells. The controller includes a generating circuit, and a selection circuit. The generating circuit generates first data based on a second data. The selection circuit retains a cumulative value whose each digit is a cumulative result in each bit of data which is already written in the memory cells. The selection circuit selects one of the first data. A selected first data has a better average of digits in a sum of each bit of the selected first data and each digit of the cumulative value than an unselected first data. The selection circuit retains the sum concerning the selected first data as the new cumulative value.

19 Claims, 22 Drawing Sheets

OTHER PUBLICATIONS

Office Action dated Jul. 14, 2009 from corresponding Japanese Appln No. 2007-050390 (w/English Abstract).
Official Action dated Aug. 13, 2009 for corresponding Korean patent application 10-2008-0017873.
Office Action dated Feb. 9, 2010 from corresponding Japanese Appln No. 2007-050390 (w/English Abstract).
Korean Official Action dated Feb. 24, 2010 for corresponding Korean Application No. 10-2008-17873 (with English translation).

* cited by examiner

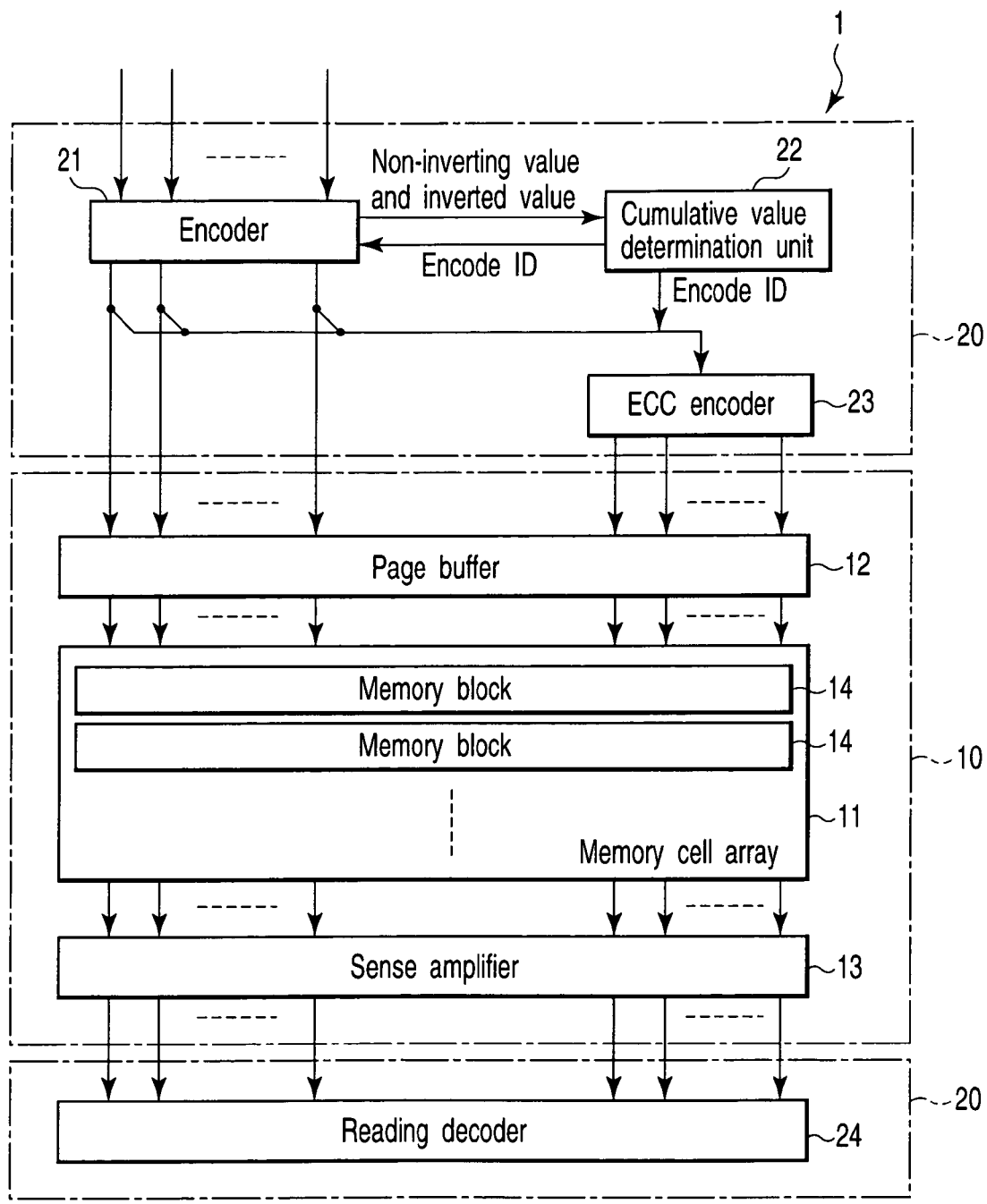
F I G. 1

| Input number | Input value | Non-inverting value / Inverted value | Cumulative value (adding result) | Determination | Encode ID | Special determination |
|---|---|---|---|---|---|---|
| 1 | 1000 | 1000 | — | X | 1 | In initial data, select one of non-inverting value and inverted value having more bits whose values are "1" |
|   |   | 0111 | 0111 | O |   |   |
| 2 | 1100 | 1100 | 1211 | O | 0 |   |
|   |   | 0011 | 0122 | X |   |   |
| 3 | 0110 | 0110 | 1321 | X | 1 |   |
|   |   | 1001 | 2212 | O |   |   |
| 4 | 0110 | 0110 | 2322 | O | 0 |   |
|   |   | 1001 | 3212 | X |   |   |
| 5 | 0000 | 0000 | 2322 | X | 1 | Select inverted value when all the bits of non-inverting value are "0" |
|   |   | 1111 | 3433 | O |   |   |
| 6 | 1100 | 1100 | 4533 | X | 1 |   |
|   |   | 0011 | 3444 | O |   |   |
| 7 | 1110 | 1110 | 4554 | O | 0 |   |
|   |   | 0001 | 3445 | X |   |   |
| 8 | 0011 | 0011 | 4565 | X | 1 | Select inverted value (encode ID is 1) in the case of the same value |
|   |   | 1100 | 5654 | O |   |   |
| 9 | 1010 | 1010 | 6664 | X | 1 | Select inverted value (encode ID is 1) in the case of the same value |
|   |   | 0101 | 5755 | O |   |   |
| 10 | 0110 | 0110 | 5865 | X | 1 |   |
|   |   | 1001 | 6756 | O |   |   |
| 11 | 0010 | 0010 | 6766 | O | 0 |   |
|   |   | 1101 | 7857 | X |   |   |

FIG. 6

| Input number | Input value | Non-inverting value / Inverted value | Adding result | Determination | Encode ID | Cumulative value | Special determination |
|---|---|---|---|---|---|---|---|
| 1 | 1000 | 1000 | — | X | 1 | 0111 | In initial data, select one of non-inverting value and inverted value having more bits whose values are "1" |
|   |      | 0111 | — | O |   |      |   |
| 2 | 1100 | 1100 | 1211 | O | 0 | 0100 |   |
|   |      | 0011 | 0122 | X |   |      |   |
| 3 | 0110 | 0110 | 0210 | X | 1 | 1101 |   |
|   |      | 1001 | 1101 | O |   |      |   |
| 4 | 0110 | 0110 | 1211 | O | 0 | 0100 |   |
|   |      | 1001 | 2102 | X |   |      |   |
| 5 | 0000 | 0000 | 0100 | X | 1 | 0100 | Select inverted value when all the bits of non-inverting value are "0" |
|   |      | 1111 | 1211 | O |   |      |   |
| 6 | 1100 | 1100 | 1200 | X | 1 | 0111 |   |
|   |      | 0011 | 0111 | O |   |      |   |
| 7 | 1110 | 1110 | 1221 | O | 0 | 0110 |   |
|   |      | 0001 | 0112 | X |   |      |   |
| 8 | 0011 | 0011 | 0121 | X | 1 | 1210 | Select inverted value (encode ID is 1) in the case of the same value |
|   |      | 1100 | 1210 | O |   |      |   |
| 9 | 1010 | 1010 | 2220 | X | 1 | 0200 | Select inverted value (encode ID is 1) in the case of the same value |
|   |      | 0101 | 1311 | O |   |      |   |
| 10 | 0110 | 0110 | 0310 | X | 1 | 1201 |   |
|    |      | 1001 | 1201 | O |   |      |   |
| 11 | 0010 | 0010 | 1211 | O | 0 | 0100 |   |
|    |      | 1101 | 2302 | X |   |      |   |

FIG. 9

| Inverted value and non-inverting value | Accumulating code |
|---|---|
| "01" | "0"("00") |
| "00" | "1"("01") |
| "10" | "2"("00") |
| "11" | "3"("11") |

| Input number | Input value | Non-inverting value / Inverted value | First encoded data / Second encoded data | Adding result | Determination | Encode ID | Cumulative value | Special determination |
|---|---|---|---|---|---|---|---|---|
| 1 | 01,11,10,11 | 01,11,10,11 | 0323 | — | ○ | 0 | 0323 | In initial data, select encoded data having larger summation of digits |
|   |   | 10,00,01,00 | 2101 | — | × |   |   |   |
| 2 | 00,01,10,00 | 00,01,10,00 | 1021 | 1344 | ○ | 0 | 1344 |   |
|   |   | 11,10,01,11 | 3203 | 3526 | × |   |   |   |
| 3 | 00,00,11,10 | 00,00,11,10 | 1132 | 2476 | × | 1 | 4654 |   |
|   |   | 11,11,00,01 | 3310 | 4654 | ○ |   |   |   |
| 4 | 11,01,00,00 | 11,01,00,00 | 3011 | 7665 | ○ | 0 | 7665 |   |
|   |   | 00,10,11,11 | 1233 | 5887 | × |   |   |   |
| 5 | 11,11,11,11 | 11,11,11,11 | 3333 | 10,9,9,8 | ○ | 0 | 10,9,9,8 | Select non-inverting value when all the non-inverting values are "11" |
|   |   | 00,00,00,00 | 1111 | 8776 | × |   |   |   |
| 6 | 00,00,00,00 | 00,00,00,00 | 1111 | 11,10,10,9 | × | 1 | 13,12,12,11 | Select inverted value when all the non-inverting values are "00" |
|   |   | 11,11,11,11 | 3333 | 13,12,12,11 | ○ |   |   |   |

FIG. 20

| Inverted value and non-inverting value | Accumulating code |
|---|---|
| "01" | "0"("00") |
| "00" | "0"("00") |
| "10" | "1"("01") |
| "11" | "1"("01") |

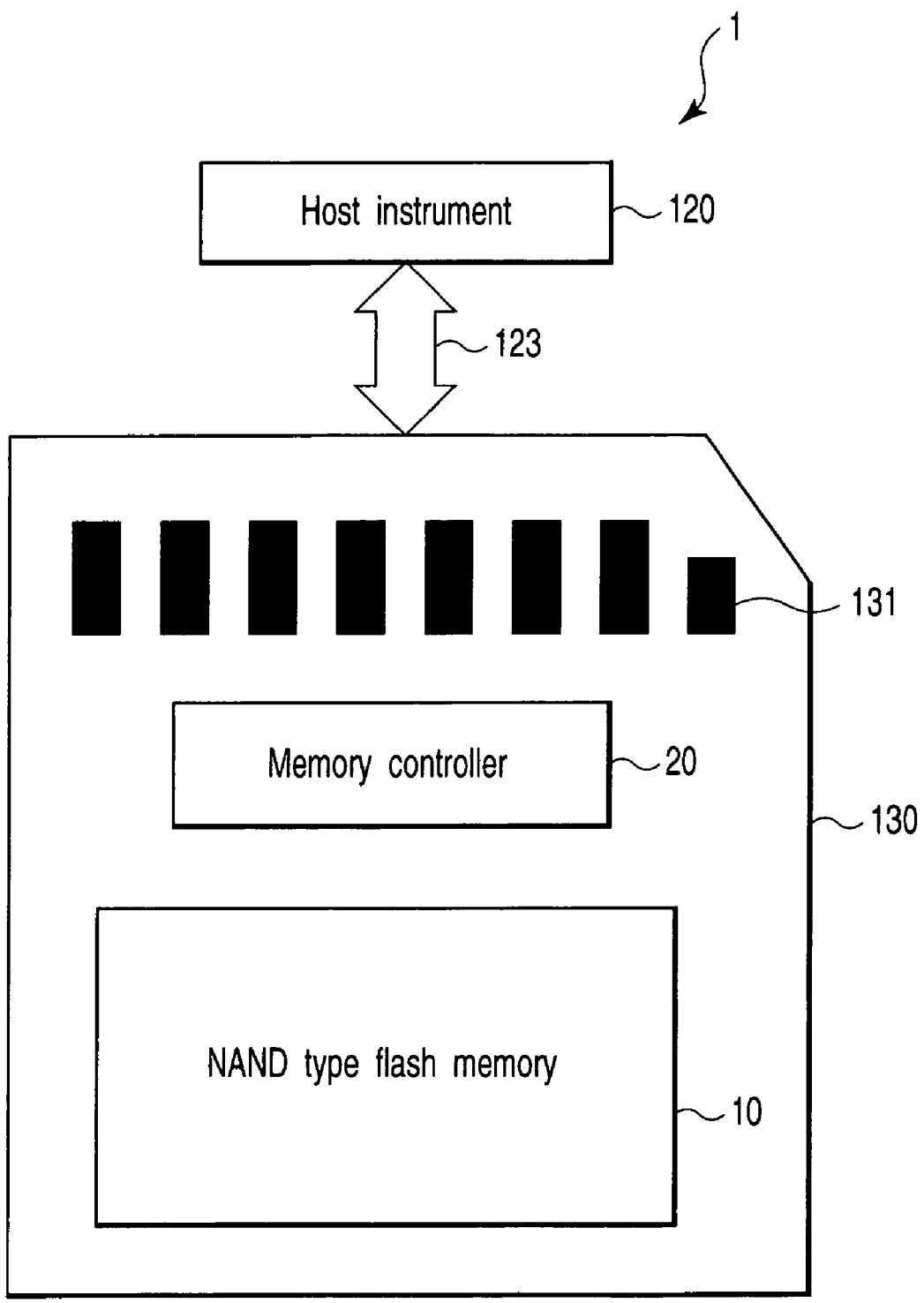
F I G. 28

MEMORY CONTROLLER CONTROLLING SEMICONDUCTOR STORAGE DEVICE AND SEMICONDUCTOR DEVICE

CROSS-REFERENCE TO RELATED APPLICATIONS

This application is based upon and claims the benefit of priority from prior Japanese Patent Application No. 2007-050390, filed Feb. 28, 2007, the entire contents of which are incorporated herein by reference.

BACKGROUND OF THE INVENTION

1. Field of the Invention

The present invention relates to a memory controller which controls a semiconductor storage device and a semiconductor device provided with the memory controller.

2. Description of the Related Art

Recently, due to the rapid spread of digital cameras and portable audio players, demand for large-capacity nonvolatile semiconductor memories has increased. A NAND type flash memory (hereinafter sometimes simply referred to as flash memory) is widely used as the nonvolatile semiconductor memory.

In the NAND type flash memory, when the number of memory cells into which electrons are injected is increased, a so-called program disturb is generated. Program disturb is a phenomenon in which data retained by a non-selected memory cell is destroyed. A program disturb is also generated if a series of identical pieces of data exist in a cell array, due to GIDL (Gate Induced Drain Leakage).

In order to prevent the program disturb from occurring, for example, JP-A H7-334991 (KOKAI) proposes a technique of averaging a charge amount in the memory cell array as a whole. However, in the technique, the charge amount is insufficiently averaged, and the generation of a series of identical pieces of data cannot be prevented. Accordingly, unfortunately, the operational reliability of the NAND type flash memory is lowered with the increased capacity of the NAND type flash memory.

BRIEF SUMMARY OF THE INVENTION

A memory controller which controls a semiconductor storage device including nonvolatile memory cells according to an aspect of the present invention includes:

a generating circuit which generates a plurality of first data based on a second data to be collectively written in the memory cells, the second data having multi-bit; and a selection circuit which retains a cumulative value whose each digit is a cumulative result in each bit of data which is already written in the memory cells, the selection circuit selecting one of the plurality of first data, a selected first data having a better average of digits in a sum of each bit of the selected first data and each digit of the cumulative value than an unselected first data, the selection circuit retaining the sum concerning the selected first data as the new cumulative value.

A semiconductor device according to an aspect of the present invention includes:

a memory controller described above; and the semiconductor storage device which includes a first memory region and a second memory region, the memory cells being arranged in each of the first memory region and the second memory region, data corresponding to the first data selected by the selection circuit of the memory controller being written in the memory cells of the first memory region, the information indicating the selected first data being written in the memory cells of the second memory region.

BRIEF DESCRIPTION OF THE SEVERAL VIEWS OF THE DRAWING

FIG. 1 is a block diagram showing a memory system according to a first embodiment;

FIG. 6 is a conceptual view showing the processing performed in the cumulative value determination unit of the first embodiment;

FIG. 9 is a conceptual view showing the processing performed in the cumulative value determination unit of the second embodiment;

FIG. 20 is a conceptual view showing the processing performed in the cumulative value determination unit of the fifth embodiment;

FIGS. 27 and 28 are block diagrams showing memory systems according to first and second modifications of the first to seventh embodiments.

DETAILED DESCRIPTION OF THE INVENTION

First Embodiment

Figure 2:
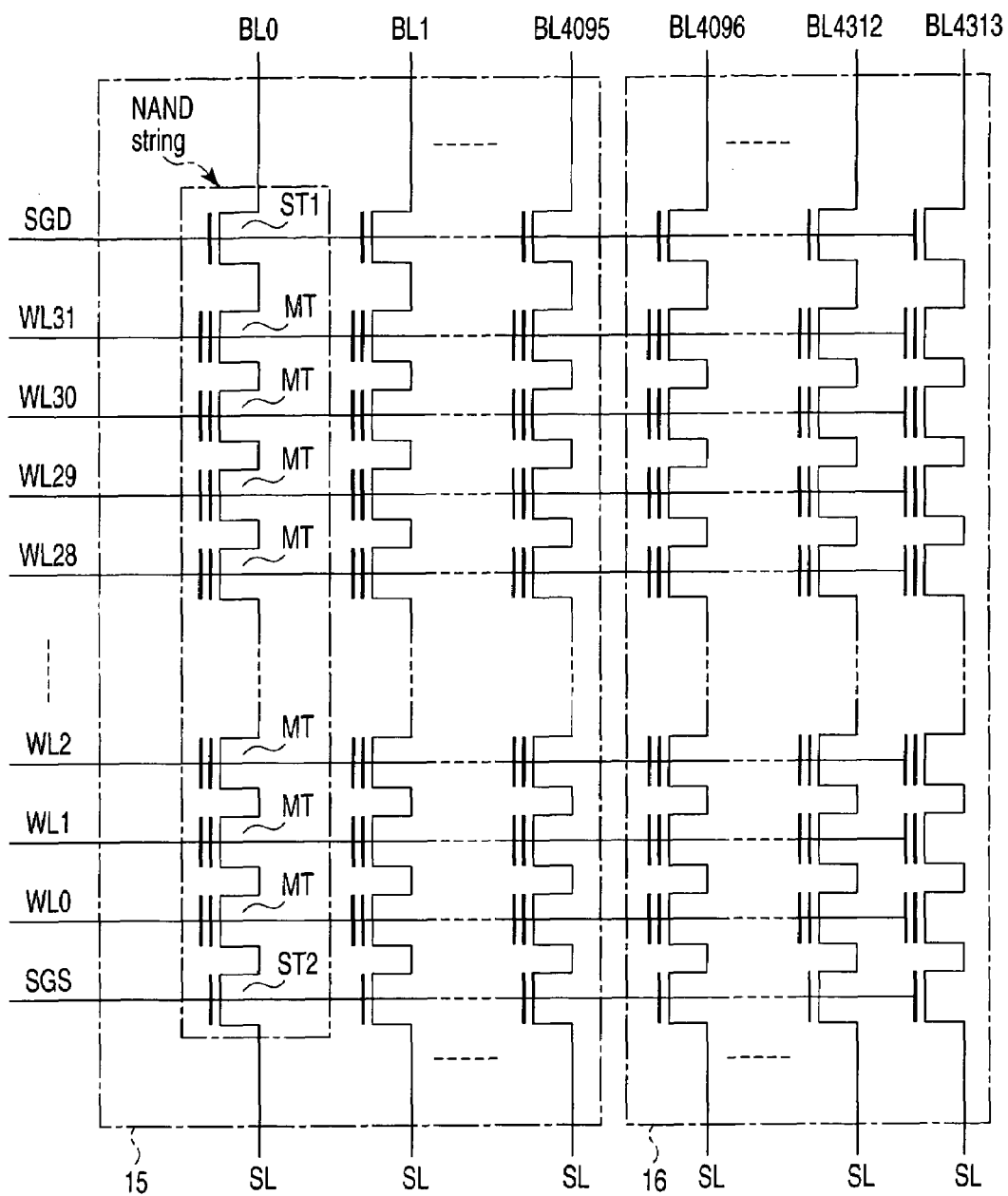
FIG. 2 is a circuit diagram showing a NAND type flash memory of the first embodiment.

A semiconductor device according to a first embodiment of the invention will be described with reference to FIG. 1. Referring to FIG. 1, a memory system 1 mainly includes a NAND type flash memory 10 and a memory controller 20 which controls the NAND type flash memory 10.

A configuration of the NAND type flash memory 10 will be described below. Hereinafter, sometimes the NAND type flash memory 10 is simply referred to as flash memory 10. The flash memory 10 includes a memory cell array 11, a page buffer 12, and a sense amplifier 13. The memory cell array 11 includes a plurality of memory blocks 14, and a plurality of nonvolatile memory cells MC are arranged in each of the memory blocks 14. Each of the memory cells MC is capable of retaining one bit, i.e., binary data. All the memory cells MC included in the same memory block 14 are collectively erased, and pieces of data are collectively written in the plurality of memory cells MC. Hereinafter, the unit of a memory cell MC in which the pieces of data are collectively written is referred to as a page. The page buffer 12 retains pieces of write data to be written in the memory cell MC in page, and the page buffer 12 writes the retained write data in the memory cell MC. The sense amplifier 13 senses and amplifies data read from the memory cell MC.

A configuration of the memory block 14 will be described below with reference to FIG. 2. FIG. 2 is a circuit diagram showing a part of the configuration of the memory block 14. Referring to FIG. 2, the memory block 14 includes a regular cell array 15 and an ECC cell array 16. The regular cell array 15 is used to retain the write data given from the outside, and the ECC cell array 16 is used to retain ECC data generated from the write data.

The regular cell array 15 and the ECC cell array 16 include a plurality of NAND strings. Each of the NAND strings includes selection transistors ST1 and ST2 and 32 memory cell transistors MT. The 32 memory cell transistors MT included in the NAND string are illustrated by way of example only. For example, 8, 32, 64, or 128 memory cell transistors MT may be included in the NAND string. In the selection transistor ST1 included in each NAND string, a drain is connected to one of bit lines BL0 to BL4313 and a gate is commonly connected to a select gate line SGD. In the selection transistor ST2, a source is commonly connected to a source line SL and a gate is commonly connected to a select gate line SGS.

Each of the memory cell transistors MT is a MOS transistor including a stacked gate which is formed on a semiconductor substrate with a gate insulating film interposed therebetween. The stacked gate includes a charge accumulation layer (for example, floating gate) formed on the gate insulating film and a control gate which is formed on the charge accumulation layer with an inter-gate insulating film interposed therebetween. In each NAND string, current paths of the 32 memory cell transistors MT are connected in series between the source of the selection transistor ST1 and the drain of the selection transistor ST2. Control gates of the memory cell transistors MT are sequentially connected to word lines WL0 to WL31 from the memory cell transistor MT located closest to the source side. Accordingly, the drain of the memory cell transistor MT connected to the word line WL31 is connected to the source of the selection transistor ST1, and the source of the memory cell transistor MT connected to the word line WL0 is connected to the drain of the selection transistor ST2.

The 4096 NAND strings having the above-described configuration are arranged in the regular cell array 15 and the 218 NAND strings are arranged in the ECC cell array 16. The 4096 bit lines BL0 to BL4095 are connected to the NAND strings in the regular cell array 15 respectively, and the 218 bit lines BL4096 to BL4313 are connected to the NAND strings in the ECC cell array 16 respectively. Accordingly, the one regular cell array 15 has a 4 k-bit memory capacity per one word line, and the one ECC cell array 16 has a 218-bit memory capacity per one word line.

Eight combinations of the regular cell array 15 and ECC cell array 16 having the above-described configurations are arranged in the one memory block 14. Accordingly, in the memory block 14, the regular cell array 15 has the memory capacity of (4 k bits×8)=4 k bytes per one word line, and the ECC cell array 16 has the memory capacity of (218 bits×8)=218 bytes. In each memory block 14, pieces of data are collectively written in the memory cell transistors MT connected to the same word line. That is, a one-page capacity becomes (4 k bytes+218 bytes). The pieces of data are collectively erased in the memory cell transistors MT in each memory block 14. That is, an erase size becomes ((4 k bytes+218 bytes)×32)=(128 k bytes+6976 bytes) because the number of word lines is 32.

Next, a configuration of the memory controller 20 will be described with reference to FIG. 1. As shown in FIG. 1, the memory controller 20 includes an encoder 21, a cumulative value determination unit 22, and an ECC encoder 23, and a reading decoder 24.

Figure 3:
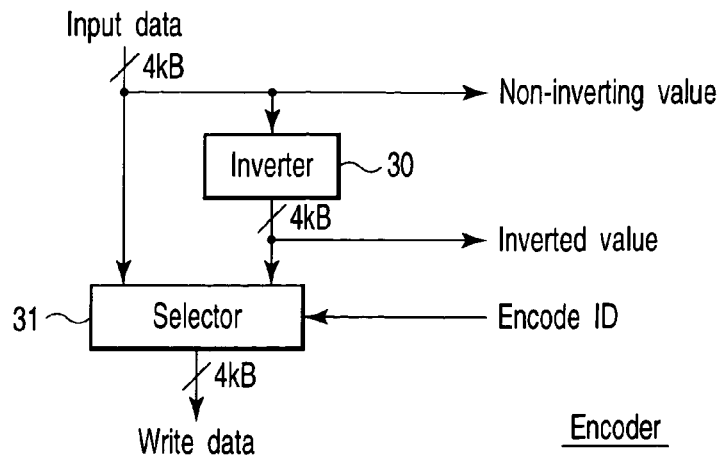
FIG. 3 is a block diagram showing an encoder of the first embodiment.

FIG. 3 is a block diagram showing an example of the configuration of the encoder 21. Referring to FIG. 3, the encoder 21 includes an inverter 30 and a selector 31. The encoder 21 receives one-page input data (4 k bytes) of the regular cell array 15 from the outside. The inverter 30 inverts each bit of the input data. The input data (non-inverting value) and the inverted value obtained by the inverter 30 are output to the cumulative value determination unit 22. The selector 31 selects one of the non-inverting value and the inverted value according to an encode ID given from the cumulative value determination unit 22, and the selector 31 outputs the selected value as write data to the page buffer 12. The write data is written in the regular cell array 15 of the memory cell array 11. The encode ID will be described later.

The memory controller 20 will further be described with reference to FIG. 1. The cumulative value determination unit 22 selects one of the non-inverting value and inverted value received from the encoder 21 to write the selected value in the memory cell array 11. The cumulative value determination unit 22 outputs the selection information as the encode ID to the encoder 21 and the ECC encoder 23. The selection operation is performed based on a cumulative value. The cumulative value shall mean a value in which the data already written in the memory cell transistor MT in a certain memory block 14 is accumulated in each bit line. Each digit of the cumulative value indicates the number of pieces of "1" data (state in which a charge is not injected into a floating gate) in each bit line, i.e., the number of memory cell transistors MT in which the "1" data is written in each NAND string. Accordingly, when the regular cell array 15 has the (4096×8) bit lines, the cumulative value also becomes the (4096×8) digits. The cumulative value determination unit 22 retains the cumulative value. The cumulative value determination unit 22 selects one of the non-inverting value and the inverted value such that, in adding the result of each bits of the non-inverting value and inverted value and each digit of the cumulative value, values of the digits of the adding result are averaged better.

The ECC encoder 23 generates ECC data based on the encode ID and the write data given from the encoder 21. The ECC encoder 23 outputs the ECC data and the encode ID given from the cumulative value determination unit 22 to the page buffer 12. The ECC data and the encode ID are written in the ECC cell array 16. Particularly, in the memory block 14, the memory cell transistor MT connected to the bit line BL4313 is used to retain the encode ID.

The reading decoder 24 decodes the read data sensed and amplified by the sense amplifier 13 based on the encode ID. That is, when the encode ID read is information indicating that the non-inverting value is selected, the reading decoder 24 directly outputs the read data. When the encode ID read is information indicating that the inverted value is selected, the reading decoder 24 inverts each bit of the read data to output the data as the decoded data.

The write operation in the memory system having the above-described configuration will be described while taking note of the operations of the encoder 21 and the cumulative value determination unit 22. The operation of the encoder 21 will be described with reference to FIG. 4.

Figure 4:
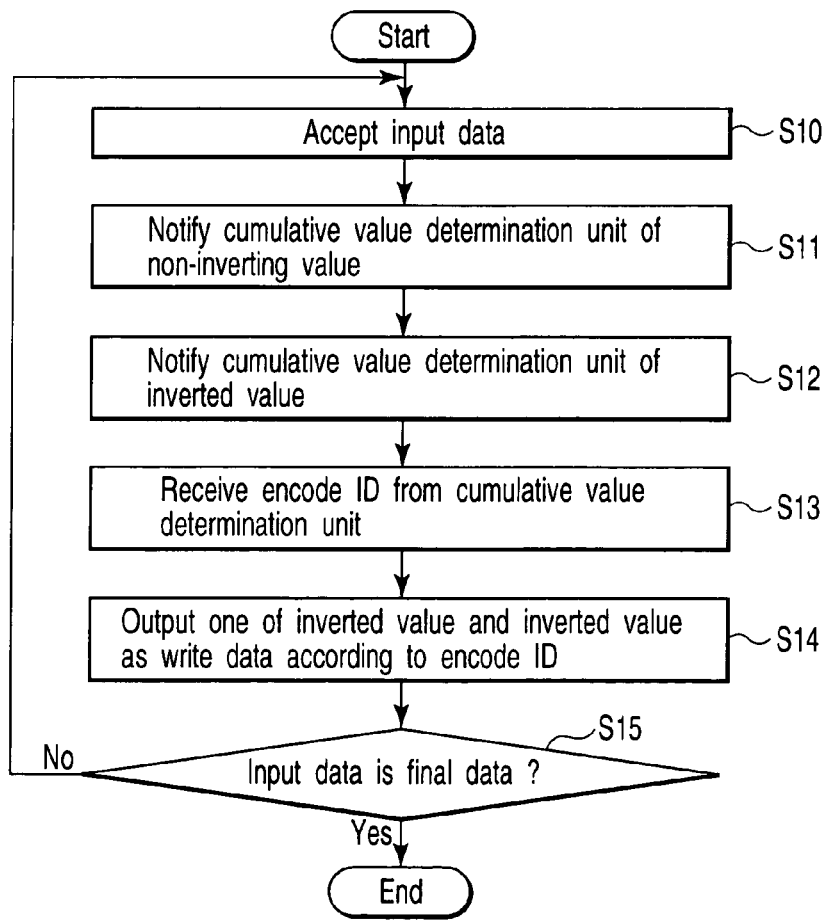
FIG. 4 is a flowchart showing processing performed in the encoder of the first embodiment.

Referring to FIG. 4, the encoder 21 accepts the one-page input data of the regular cell array 15 from the outside (Step S10). The encoder 21 directly notifies the cumulative value determination unit 22 of the accepted input data as the non-inverting value (Step S11). At the same time, the encoder 21 inverts the input data using the inverter 30, and the encoder 21 notifies the cumulative value determination unit 22 of the inverted value (Step S12). Then, the encoder 21 receives the encode ID from the cumulative value determination unit 22 (Step S13). The selector 31 of the encoder 21 outputs one of the non-inverting value and the inverted value as the write data to the NAND type flash memory 10 according to the encode ID (Step S14). The plurality of pieces of input data are continuously input to the encoder 21. When the input data is the final data (YES in Step S15), the processing is ended. When the input data is not the final data (NO in Step S15), the flow returns to Step S10.

The operation of the cumulative value determination unit 22 will be described with reference to FIG. 5. Referring to FIG. 4, the cumulative value determination unit 22 accepts the non-inverting value from the encoder 21 (Step S20), and the cumulative value determination unit 22 receives the inverted value (Step S21). When the received non-inverting value and inverted value are the initial input data for the memory block 14 (YES in Step S22), the cumulative value determination unit 22 selects one of the non-inverting value and the inverted value having more bits whose values are "1". When the non-inverting value is identical to the inverted value in the number of bits whose values are "1", the cumulative value determination unit 22 selects the inverted value. The selection information is output as the encode ID to the encoder 21 and the ECC encoder 23 (Step S23). As a result, the write data output from the encoder 21 is written in the regular cell array 15, the ECC data and encode ID which are generated based on the write data are written in the ECC cell array 16. The cumulative value determination unit 22 retains one of the non-inverting value and inverted value selected in Step S23 as the cumulative value (Step S24). When the data which is selected in Step S23 and written in the memory cell MC is the final write data for the memory cell block 14 (YES in Step S25), the processing is ended. When the data is not the final write data (NO in Step S25), the flow returns to Step S20 to repeat the processing.

When the received non-inverting value and inverted value are not the initial input data (NO in Step S22), the cumulative value determination unit 22 determines whether or not all the bits of the non-inverting value are "0". When all the bits of the non-inverting value are "0" (YES in Step S26), the cumulative value determination unit 22 selects the inverted value to output the selection information as the encode ID to the encoder 21 and the ECC encoder 23 (Step S27). Accordingly, in this case, the inverted value is written in the regular cell array 15. The cumulative value determination unit 22 retains the adding result of each bit of the selected value and each digit of the cumulative value owned by itself as the new cumulative value (Step S28). That is, after Step S27, the cumulative value retained by the cumulative value determination unit 22 at that time is updated by the value to which the inverted value is further added. Then, the flow goes to Step S25.

When all the bits of the non-inverting value are not "0", namely, when one of the bits is "1" (NO in Step S26), the cumulative value determination unit 22 determines whether or not all the bits of the non-inverting value are "1". When all the bits of the non-inverting value are "1" (YES in Step S29), the cumulative value determination unit 22 selects the non-inverting value to output the selection information as the encode ID to the encoder 21 and the ECC encoder 23 (Step S30). Accordingly, in this case, the non-inverting value is written in the regular cell array 15. Then, the flow goes to the processing in Step S28. That is, after Step S30, the cumulative value retained by the cumulative value determination unit 22 is updated by the value to which the non-inverting value is further added. Then, the flow goes to Step S25.

When all the bits of the non-inverting value are not "1", namely, when one of the bits is "0" (NO in Step S29), the flow goes to the processing in Step S31. In Step S31, the cumulative value determination unit 22 adds each digit of the cumulative value owned by itself and each bit of the non-inverting value and the inverted value received in Steps S20 and S21. The cumulative value determination unit 22 computes a difference between the maximum value and the minimum value of each digit in each adding result of the non-inverting value and the inverted value (Step S31). Then, the cumulative value determination unit 22 makes a determination of a magnitude relation of the difference obtained for each adding result of the non-inverting value and the inverted value obtained in Step S31 (Step S32). When the difference between the maximum value and the minimum value of the adding result for the non-inverting value is lower than the difference between the maximum value and the minimum value of the adding result for the inverted value (NO in Step S33), the cumulative value determination unit 22 selects the non-inverting value. The cumulative value determination unit 22 outputs the information indicating that the non-inverting value is selected as the encode ID to the encoder 21 and the ECC encoder 23 (Step S34). That is, the non-inverting value is written in the regular cell array 15.

On the contrary, the cumulative value determination unit 22 selects the inverted value, when the difference between the maximum value and the minimum value of the adding result for the non-inverting value is not lower than the difference between the maximum value and the minimum value of the adding result for the inverted value (YES in Step S33). The cumulative value determination unit 22 outputs the information indicating that the inverted value is selected as the encode ID to the encoder 21 and the ECC encoder 23 (Step S35). That is, the inverted value is written in the regular cell array 15.

After Steps S34 and S35, the cumulative value determination unit 22 goes to the processing in Step S28.

The processing of FIGS. 4 and 5 will be described below with reference to specific examples. FIG. 6 is a diagram showing various signals used in the cumulative value determination unit 22. FIG. 6 shows the case in which the one page has a four-bit size by way of example. In FIG. 6, an "input number" indicates an input order of a plurality of pieces of page data written in the memory block 14. An "input value" means input data input to the encoder 21 from the outside in each input number. A "cumulative value (adding result)" indicates a cumulative value for an input number 1 and the "cumulative value" indicates the adding result obtained in Step S31 for an input number 2 and more. "Determination" indicates whether the non-inverting value or the inverted value is selected in Steps S23, S27, S30, S34, and S35, a mark "o" indicates that the selection is done, and a mark "x" indicates that the selection is not done. The encode ID becomes "0" when the non-inverting value is selected, and the encode ID becomes "1" when the inverted value is selected. The input data, the non-inverting value, and the inverted value are expressed as a binary number, and the cumulative value is expressed as a decimal number.

First, the initial input data "1000" is input to the encoder. In this case, the non-inverting value and the inverted value become "1000" and "0111" respectively. Because the input data "1000" is the initial data written in the memory block 14 (YES in Step S22), the cumulative value determination unit 22 selects one of the non-inverting value and inverted value having more bits whose values are "1", i.e., the inverted value "0111" (Step S23). The cumulative value becomes "0111", and the encoder 21 and ECC encoder 23 are notified of "1" as the encode ID (Step S24).

Then, input data "1100" is input to the encoder. In this case, the non-inverting value and the inverted value become "1100" and "0011" respectively. The input data "1100" is not the initial data (NO in Step S22), all the bits of the non-inverting value of the input data "1100" are not "0" (NO in Step S26), and all the bits of the non-inverting value are not "1" (NO in Step S29). Therefore, the cumulative value determination unit 22 adds each digit of the cumulative value and each bit of the non-inverting value and inverted value (Step S31). Then, at this point, because the cumulative value is "0111", the adding result of the cumulative value and the non-inverting value "1100" becomes "1211". The adding result of the cumulative value and the inverted value "0011" becomes "0122". In the adding result of the cumulative value and the non-inverting value, the maximum value of each digit becomes "2" while the minimum value becomes "1". Therefore, the difference between the maximum value and the minimum value becomes "1". In the adding result of the cumulative value and the inverted value, the maximum value of each digit becomes "2" while the minimum value becomes "0". Therefore, the difference between the maximum value and the minimum value becomes "2". Accordingly, the difference between the maximum value and the minimum value of "1" in the adding result for the non-inverting value is lower than the difference between the maximum value and the minimum value of "2" in the adding result for the inverted value (NO in Step S33). Accordingly, the cumulative value determination unit 22 selects the non-inverting value "1100" to set the encode ID to "0". The cumulative value determination unit 22 retains the adding result "1211" for the inverted value as the new cumulative value (Step S28). In FIG. 6, the shaded adding result becomes the new cumulative value in the input number "2" and or more.

The same processing as for the input number "2" is performed on the input numbers "3" and "4".

Next, the input number "5" will be described. The fifth input data is "0000". In this case, the non-inverting value and the inverted value become "0000" and "1111" respectively. Since the input data "0000" is not the initial data (NO in Step S22), and all the bits of the non-inverting value are "0" (YES in Step S26), the cumulative value determination unit 22 selects the inverted value "1111" (Step S27). At this point, because the cumulative value becomes "2322", the adding result "3433" of the cumulative value "2322" and the inverted value "1111" becomes the new cumulative value (Step S28).

The same processing as the input number "2" is performed on the input numbers "6" and "7".

Next, the input number "8" will be described. The eighth input data is "0011". In this case, the non-inverting value and the inverted value become "0011" and "1100" respectively. The cumulative value determination unit 22 adds each digit of the cumulative value and each bit of the non-inverting value and the inverted value (Step S31). At this point, because the cumulative value becomes "4554", the adding result of the cumulative value and the non-inverting value "0011" becomes "4565". The adding result of the cumulative value and the inverted value "1100" becomes "5654". In the adding result of the cumulative value and the non-inverting value, the maximum value of each bit becomes "6" and the minimum value becomes "5". Therefore, the difference between the maximum value and the minimum value becomes "1". In the adding result of the cumulative value and the inverted value, the maximum value of each digit becomes "6" and the minimum value becomes "5", Therefore, the difference between the maximum value and the minimum value becomes "1". Accordingly, the difference between the maximum value and the minimum value of "1" in the adding result for the non-inverting value is equal to the difference between the maximum value and the minimum value of "1" in the adding result for the inverted value (YES in Step S33). Accordingly, the cumulative value determination unit 22 selects the inverted value "1100" to set the encode ID to "1". The cumulative value determination unit 22 retains the adding result "5654" for the inverted value as the new cumulative value (Step S28).

The same processing as for the input number "8" is performed on the input number "9", and the same processing as for the input number "2" is performed on the input numbers "10" and "11".

In the memory system according to the first embodiment of the invention, the following effects (1) and (2) are obtained.

(1) The operation reliability of the semiconductor storage device can be improved (Part 1).

In the configuration of the first embodiment, the memory controller 20 includes the cumulative value determination unit 22 which accumulates and retains the already-written data in each bit line. The cumulative value determination unit 22 determines whether the input data is directly written or the input data is written inverted according to the cumulative value. Accordingly, the operation reliability of the NAND type flash memory can be improved. The effect will be described below.

For example, in the NAND type flash memory disclosed in JP-A H7-334991 (KOKAI), a charge amount is averaged in the memory cell array as a whole. However, the charge amount is only averaged in the memory cell array as a whole, without considering any variation in the charge amount among the bit lines. Accordingly, the charges are possibly concentrated on one of the bit lines. When the charges are concentrated on one of the bit lines, a data error is easily created in the bit line. In the NAND type flash memory having the ECC function, it is necessary that ECC be performed to be able to aid the bit line in which the error is created most easily. Therefore, unfortunately, the ECC efficiency is lowered when the charges are concentrated on one of the bit lines.

On the contrary, in the configuration of the first embodiment, the data written in the memory cell transistor MT in the past is accumulated in each bit line. The non-inverting value and inverted value of the data to be newly written and the cumulative value are added, and the adding result in which the difference between the maximum value and the minimum value of each digit becomes the minimum is selected. That is, each digit of the adding result indicates the total number of the "1" data in each bit line. Accordingly, as the difference between the maximum value and the minimum value of each digit are increased in the adding result, the variation in charge amount is increased among the bit lines. Therefore, one of the non-inverting value and the inverted value is selected, such that the difference between the maximum value and the minimum value of each digit becomes smaller, namely, such that the variation in charge amount is decreased among the bit lines, and the selected value is written in the memory cell transistor MT.

Accordingly, the number of memory cell transistors MT which retain the "1" data is averaged among the bit lines. This enables the charges to be prevented from concentrating on one of the bit lines. Therefore, a probability of creating a data error is averaged among the bit lines to improve the ECC efficiency, which allows the operation reliability to be improved in the NAND type flash memory 10.

(2) The operation reliability of the semiconductor storage device can be improved (Part 2).

Recently, demands for large-capacity NAND type flash memories are increasing. At the same time, the reliability of write data and read data tends to be gradually lowered. This is attributed to the fact that, in the NAND type flash memory, a film thickness of the gate insulating film (tunnel oxide film) cannot be thinned lower than a predetermined value due to the data recording method using a tunnel current, whereas lateral sizes such as a gate length and a gate width of the memory cell transistor MT are reduced, whereby the recording data destruction caused by the GIDL phenomenon becomes pronounced.

Additionally, the number of memory cell transistors is increased in the NAND string because an area per bit is reduced. As a result, the current which can be passed through the NAND string is decreased, and a voltage change and current value which are required to read and sense the data are also decreased.

Increasing the number of memory cell transistors in the NAND string tends to lower the resistance against the read disturb (hereinafter abbreviated to RD) and program disturb (hereinafter abbreviated to PD). When the continuous memory cell transistors connected in series in the NAND string are turned on, the lowering of the resistance against RD and PD becomes more pronounced as the number of continuous memory cell transistors is increased. The following reasons can be cited for this.

In each memory cell transistor MT, there is a parasitic capacitance formed by a p-n junction between the source or drain region of the memory cell transistor and the well region in which the memory cell transistor is formed. When the plurality of memory cell transistors MT continuously connected in a column direction are turned on, a large parasitic capacitance is created in the NAND string. That is, the parasitic capacitances of the turned-on memory cell transistors are connected in parallel to form a very high parasitic capacitance. This very high parasitic capacitance has various negative effects on the NAND type flash memory.

For example, when the read voltage is applied to one of the word lines WL, the large amount of charge (current) supplied from the parasitic capacitance is accelerated to create hot electrons due to the gate voltage of the word line WL. The created hot electrons escape from the tunnel oxide film of the memory cell transistor connected to the word line WL, and destroy the data recorded in the memory cell transistor. This is the so-called GIDL phenomenon. Furthermore, when many continuous memory cell transistors are turned on, not only RD but also PD are easily generated.

However, in the configuration of the first embodiment, the input data is written while non-inverting inverted or inverted. In the input data, even if continuous pieces of "0" data exist in one of the bit lines, the "1" data which is the inverted value is written according to the determination result of the cumulative value determination unit 22, and the continuous pieces of "0" data can be prevented from existing on the same column. Accordingly, such continuous memory cell transistors can be prevented from being simultaneously turned on in the NAND string, which resolves the problem of RD and PD to improve the operation reliability of the NAND type flash memory.

Figure 7:
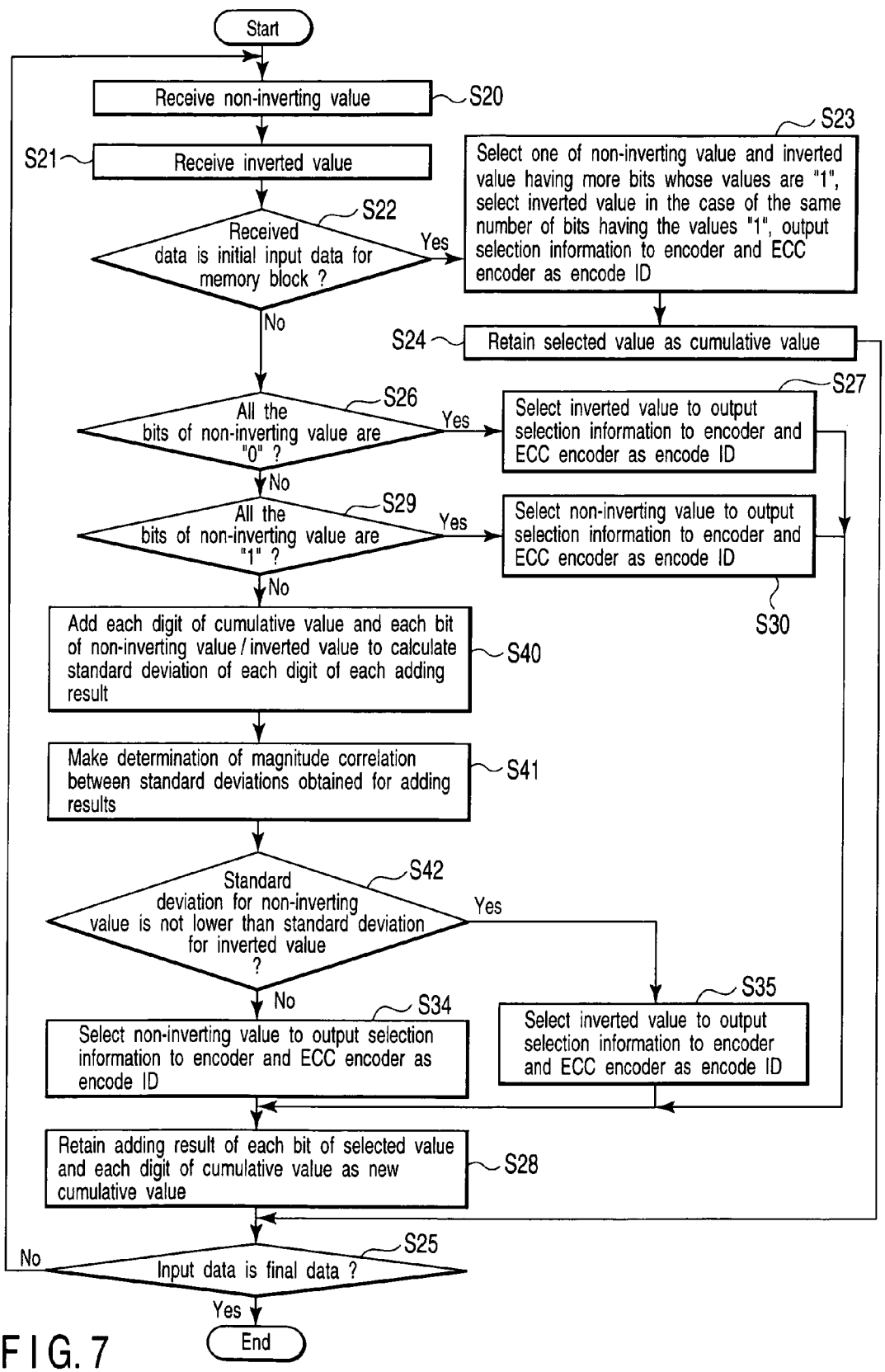
FIG. 7 is a flowchart showing processing performed in a cumulative value determination unit according to a modification of the first embodiment.

In the first embodiment, the determination of the magnitude relation of the difference between the maximum value and the minimum value of each digit in the adding result of the cumulative value and the non-inverting value and inverted value is made in Steps S31 to S33. However, it is not always necessary that the determination processing be performed based on the maximum value and the minimum value of each digit in the adding result. For example, the determination processing may be performed using standard deviation. FIG. 7 is a flowchart showing a flow of the processing performed in the cumulative value determination unit 22 when the determination processing is performed with standard deviation.

As shown in FIG. 7, when all the bits of the non-inverting value are not "1" (NO in Step S29), the cumulative value determination unit 22 adds each digit of the cumulative value and each bit of the non-inverting value and the inverted value. Then, the cumulative value determination unit 22 calculates the standard deviation in each adding result for the non-inverting value and the inverted value (Step S40). Then, the cumulative value determination unit 22 makes a determination of the magnitude relation between the standard deviations of the adding results for the non-inverting value and the inverted value (Step S41). When the standard deviation of the adding result of the cumulative value and the non-inverting value is lower than the standard deviation of the adding result of the cumulative value and the inverted value (NO in Step S42), the flow goes to Step S34. On the other hand, when the standard deviation of the adding result of the cumulative value and the non-inverting value is not lower than the standard deviation of the adding result of the cumulative value and the inverted value (YES in Step S42), the flow goes to Step S35. The method of FIG. 7 also obtains the effects (1) and (2) described above.

Second Embodiment

A semiconductor device according to a second embodiment of the invention will be described. In the second embodiment, "1" is subtracted from a value of each digit when all the digits of the cumulative value are at least "1" in the first embodiment. In the second embodiment, the configuration of the memory system 1 and the operation of the encoder 21 are similar to those of the first embodiment, therefore only the points different in the second embodiment will be described below.

Figure 5:
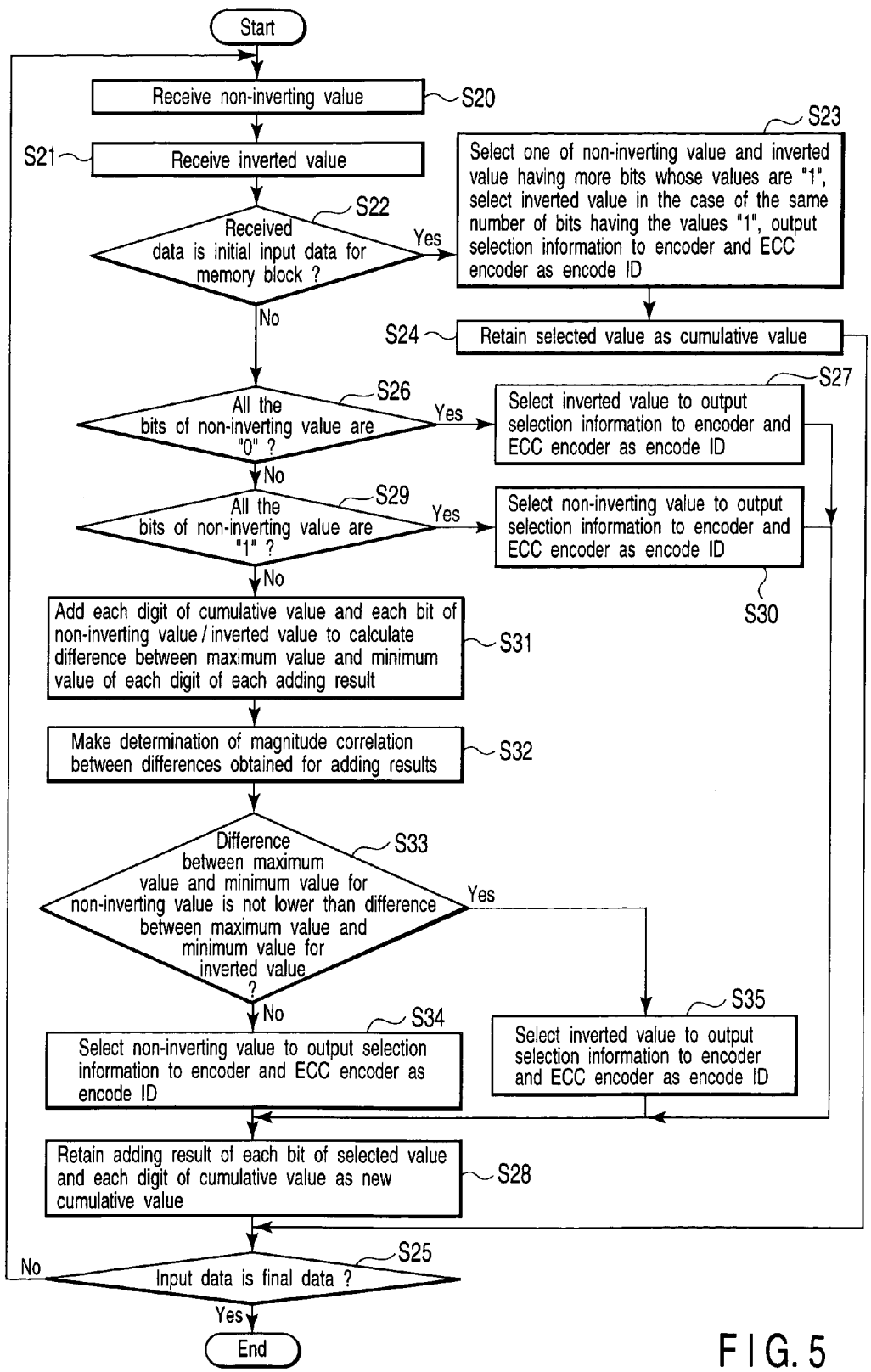
FIG. 5 is a flowchart showing processing performed in a cumulative value determination unit of the first embodiment.
Figure 8:
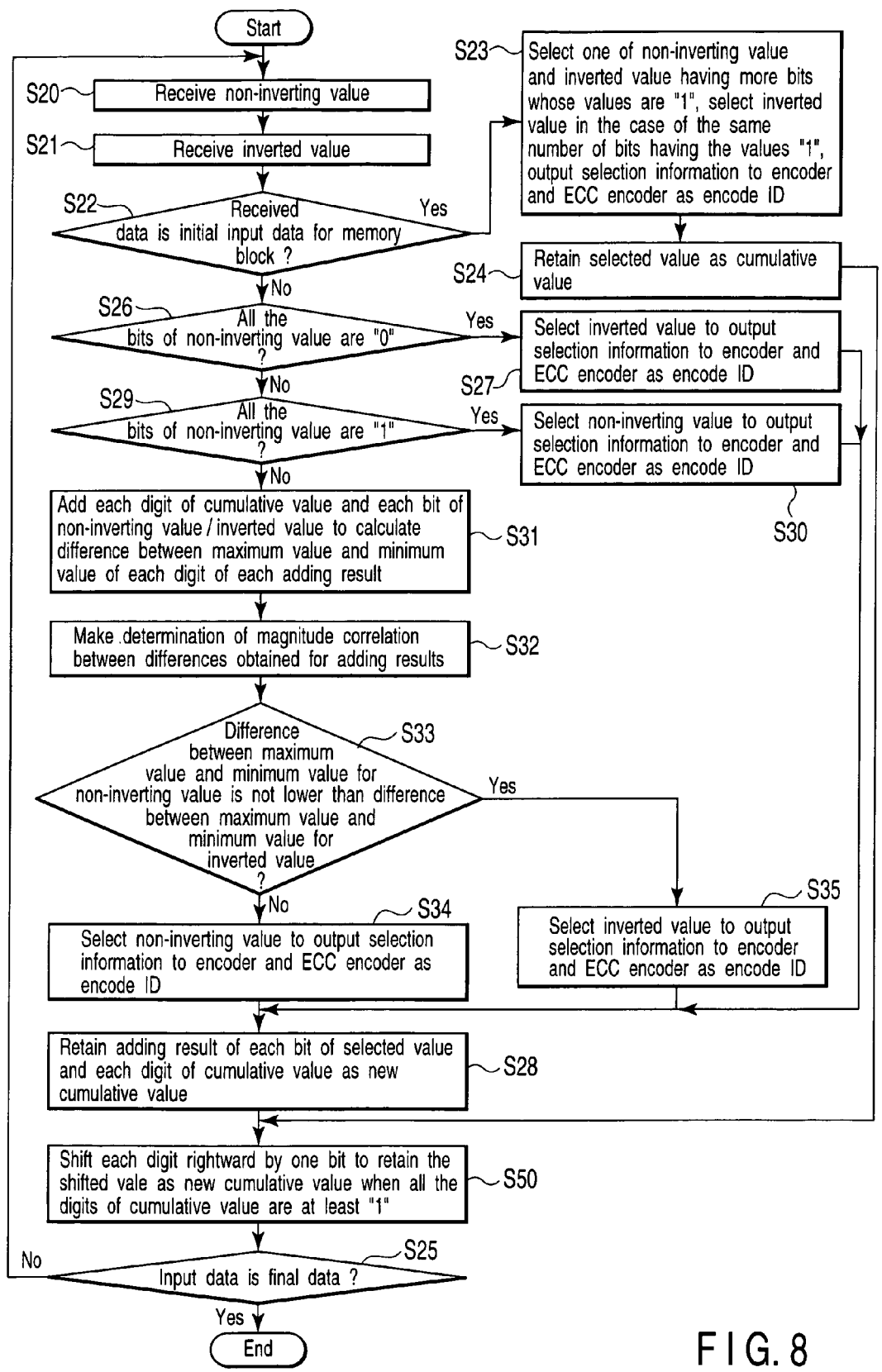
FIG. 8 is a flowchart showing processing performed in a cumulative value determination unit according to a second embodiment.

As shown in FIG. 8, the second embodiment differs from the first embodiment of FIG. 5 in that the processing in Step S50 is performed after Steps S24 and S28. In Step S50, the cumulative value determination unit 22 determines whether or not all the digits of the cumulative value obtained in Steps S24 and S28 are at least "1". When all the digits are at least "1", the cumulative value determination unit 22 subtracts "1" from each value of all the digits, and the cumulative value determination unit 22 retains the subtracted value as the new cumulative value.

The processing of FIG. 8 will be described below with reference to a specific example. FIG. 9 is a table showing various signals used in the cumulative value determination unit 22, and FIG. 9 shows the information similar to that of FIG. 6.

Referring to FIG. 9, for the input number "2", the adding result of the cumulative value "0111" and the non-inverting value "1100" becomes "1211", and the adding result of the cumulative value "0111" and the inverted value "0011" becomes "0122". Then, in Step S28, the cumulative value determination unit 22 retains the adding result "1211" as the cumulative value. Then, in Step S50, because all the digits are at least "1" in the cumulative value "1211", "1" is subtracted from each digit of the cumulative value "1211" to obtain "0100", and the cumulative value determination unit 22 retains "0100" as the new cumulative value.

For the input number "3", the cumulative value "0100" obtained in Step S50 and the non-inverting value "0110" or the inverted value "1001" are added. The adding result for the non-inverting value becomes "0210", and the adding result for the inverted value becomes "1101". Accordingly, the cumulative value determination unit 22 retains the adding result "1101" as the cumulative value. In this case, because the second digit of the cumulative value is "0", the cumulative value determination unit 22 directly retains the adding result "1101" as the cumulative value without subtracting "1" from each digit in Step S50.

The same processing as above is applied for the input number "4" or more.

Thus, according to the memory system 1 of the second embodiment, the effect (3) is obtained in addition to the effects (1) and (2) described in the first embodiment.

(3) The size of the memory controller 20 can be reduced (Part 1).

In the case where the cumulative value is one in which pieces of data written in the past are simply accumulated, the maximum value is equal to the number of word lines in the NAND string in which the cumulative value is counted. For example, in the case of 32 word lines, the value of each digit becomes "32" at the maximum as the cumulative value. Therefore, each digit of the cumulative value becomes five-bit data in the binary number, and a five-stage register is required for each digit of the cumulative value.

On the other hand, in the configuration of the second embodiment, when the value of each digit of the cumulative value exceeds "1", "1" is subtracted from all the digits. Therefore, the possibility that each digit of the cumulative value equals the available maximum value ("32" in the case of 32 word lines) is reduced, so that the number of registers can be decreased for each digit of the cumulative value to reduce the size of the memory controller 20.

An absolute value of the cumulative value has no meaning, and it is only necessary to know the difference in values between the bits of the cumulative value. This is because the difference in values between the digits of the cumulative value means the difference in the charge between the bit lines. Accordingly, the charge averaging among the bit lines is not affected even if "1" is subtracted from the value of each digit of the cumulative value like the embodiment.

In the second embodiment, the processing in Steps S31 to S33 can also be replaced by Steps S40 to S42 described in FIG. 7.

Third Embodiment

A semiconductor device according to a third embodiment of the invention will be described. In the third embodiment, when an overflow is generated in one of the digits of the adding result in the second embodiment, the value of the digit generating the overflow is replaced by a quotient of "2" of the countable maximum value in the digit, and each of the other digits is replaced by a quotient of "2" of a retained value. In the third embodiment, the configuration of the memory system 1 and the operation of the encoder 21 are similar to those of the first and second embodiment, therefore only the points different in the third embodiment will be described below.

Figure 10:
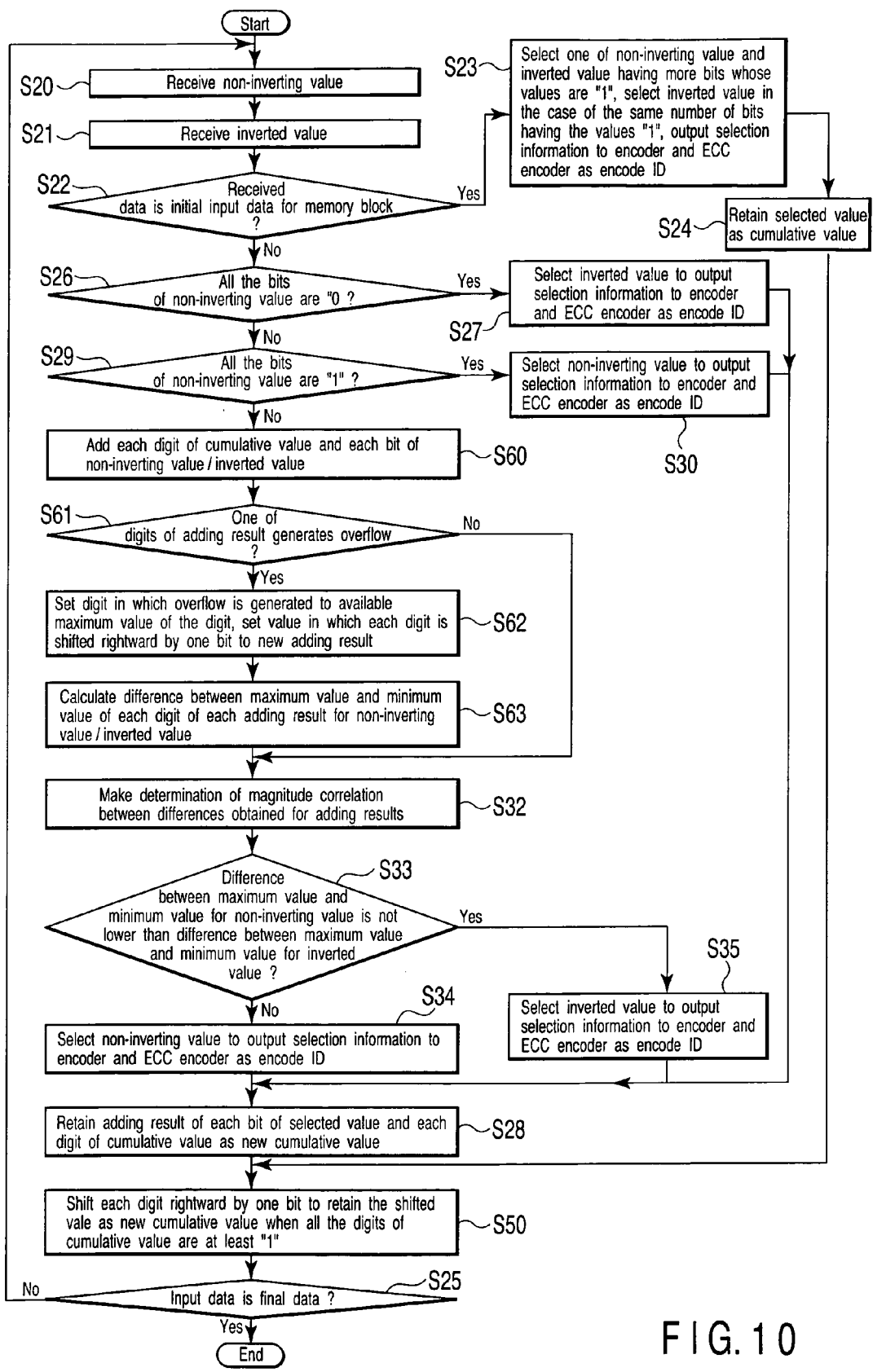
FIG. 10 is a flowchart showing processing performed in a cumulative value determination unit according to a third embodiment.

As shown in FIG. 10, the third embodiment differs from the second embodiment of FIG. 8 in that Step S31 is replaced by Steps S60 to S63. When all the bits of the non-inverting value are not "1" (NO in Step S29), the cumulative value determination unit 22 adds each digit of the cumulative value and each bit of the non-inverting value and inverted value (Step S60). The cumulative value determination unit 22 determines whether or not an overflow is generated in one of the digits of the adding result obtained in Step S60. When an overflow is not generated (NO in Step S61), the flow goes to the processing in Step S32. The processing in Step S32 is similar to that of the first and second embodiments.

When an overflow is generated (YES in Step S61), the cumulative value determination unit 22 sets the digit in which the overflow is generated to the available maximum value of the digit, and the cumulative value determination unit 22 sets the value in which all the digits are shifted rightward by one bit to the new adding result (Step S62). Assuming that "7" is the maximum value in a certain digit of the cumulative value, when the value of the digit becomes "8" to generate an overflow, the value of the digit is set to the maximum value "7" ("111" in the binary number). Then, all the digits are shifted rightward by one bit. That is, "111" is set to "011" ("3" in the decimal number). The resultant "3" is set as the adding result for the digit. In other words, the digit in which an overflow is generated is replaced by "3", which is the quotient obtained by dividing the available maximum value "7" of the digit by "2". Remainders of the division are rounded down. For other digits, the same processing is performed on the retained values.

The difference between the maximum value and the minimum value of each digit in the adding results for the non-inverting value and the inverted value is computed using the adding result obtained in Step S62 (Step S63), and the flow goes to Step S32. The processing from Step S32 is similar to that of the first and second embodiments.

Thus, according to the memory system 1 of the third embodiment, the effect (4) is obtained in addition to the effects (1) and (2) of the first embodiment and the effect (3) of the second embodiment.

(4) The size of the memory controller 20 can be reduced (Part 2).

Figure 11:
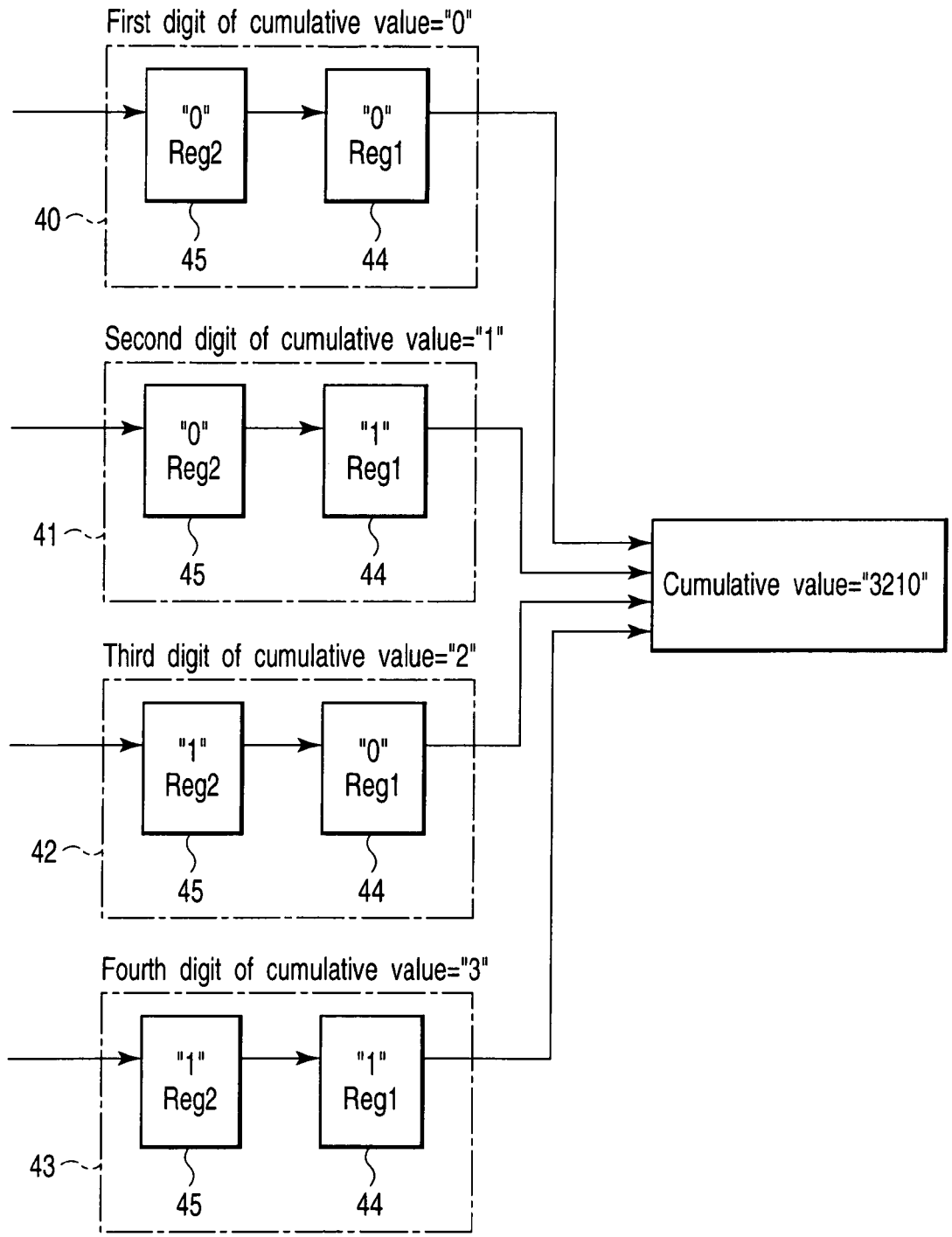
FIG. 11 is a block diagram showing the cumulative value determination unit of the third embodiment.

FIG. 11 is a block diagram showing a cumulative value retaining unit which retains the cumulative value in the cumulative value determination unit 22. FIG. 11 shows the state of the four-digit cumulative value, i.e., the four bit lines.

Referring to FIG. 11, the cumulative value retaining unit includes four retaining units 40 to 43. Each of the retaining units 40 to 43 retains the value of each digit of the four-digit cumulative value. Each of the retaining units 40 to 43 includes two registers 44 and 45, and each of the registers 44 and 45 retains binary one-bit data. FIG. 11 shows the state in which "3210" is retained as the cumulative value. The registers 44 and 45 of the retaining unit 40 retain "0" and "0" respectively, the registers 44 and 45 of the retaining unit 41 retain "0" and "1" respectively, the registers 44 and 45 of the retaining unit 42 retain "1" and "0" respectively, and the registers 44 and 45 of the retaining unit 43 retain "1" and "1" respectively.

In this state, it is assumed that "1000" is further added. Because "1" is added to the retaining unit 43, although the adding result should be "3"+"1"="4" under normal circumstances, the retaining unit 43 can count up to only "3". That is, an overflow is generated, which results in incorrect addition.

On the other hand, in the third embodiment, a countermeasure to be taken in the case of an overflow is previously determined. Specifically, the quotient of "2" of the maximum value which can be retained by the retaining unit 43 is set as the value which should be retained when the overflow is generated. Accordingly, "1" which is the quotient obtained by dividing "3" by "2" is retained as shown in FIG. 11. In other words, the values of the registers 44 and 45 included in the retaining unit 43 are set to "1", and the values are shifted rightward by one bit. For the retaining units 40, 41, and 42, when the retained values are shifted rightward by one bit, the values "0", "0", and "1" are obtained, and "1100" is retained as the new cumulative value.

Therefore, correct processing can be performed even if an overflow is generated. The processing of the third embodiment exerts a pronounced effect, in particular when the third embodiment is combined with the second embodiment. In the second embodiment, "1" is subtracted from each digit of the cumulative value to decrease the number of registers for retaining the cumulative value. In this case, the possible maximum value of each digit of the cumulative value is empirically determined. Therefore, when the number of registers is excessively decreased, an overflow is possibly generated in each digit of the cumulative value. Even in such cases, the countermeasure as in the third embodiment is taken against the overflow, which allows the processing to be correctly performed while the number of registers is effectively decreased.

In the NAND type flash memory 10, the pieces of data are sequentially written from the memory cell transistor MT (memory cell transistor MT connected to the word line WL0) located close to the select gate line SGS on the source side. Accordingly, the charge amounts among the bit line should be taken care of in the memory cell transistor MT close to the select gate line SGS. The overflow of the cumulative value is generated in the memory cell transistor MT in which the data is written late, i.e., in the memory cell transistor MT located close to the select gate line SGD on the drain side, and no overflow of the cumulative value is generated when data is written in the memory cell transistor MT located close to the select gate line SGS on the source side. Therefore, even if the difference in charge amount among the bit lines is not correctly represented in the cumulative value due to the generation of an overflow, the data write is already ended in the memory cell transistor MT located close to the select gate line SGS at that time, actually there is created no problem.

In the third embodiment, the processing in Steps S63 and S32 may be performed using the standard deviation described in the first embodiment of FIG. 7. The processing in Step S50 is not always required, and may be omitted.

Fourth Embodiment

A semiconductor device according to a fourth embodiment of the invention will be described. In the fourth embodiment, the encoder 21 is formed with a pseudo-random number generator in the first to third embodiments. Only the points different in the fourth embodiment will be described below.

Figure 12:
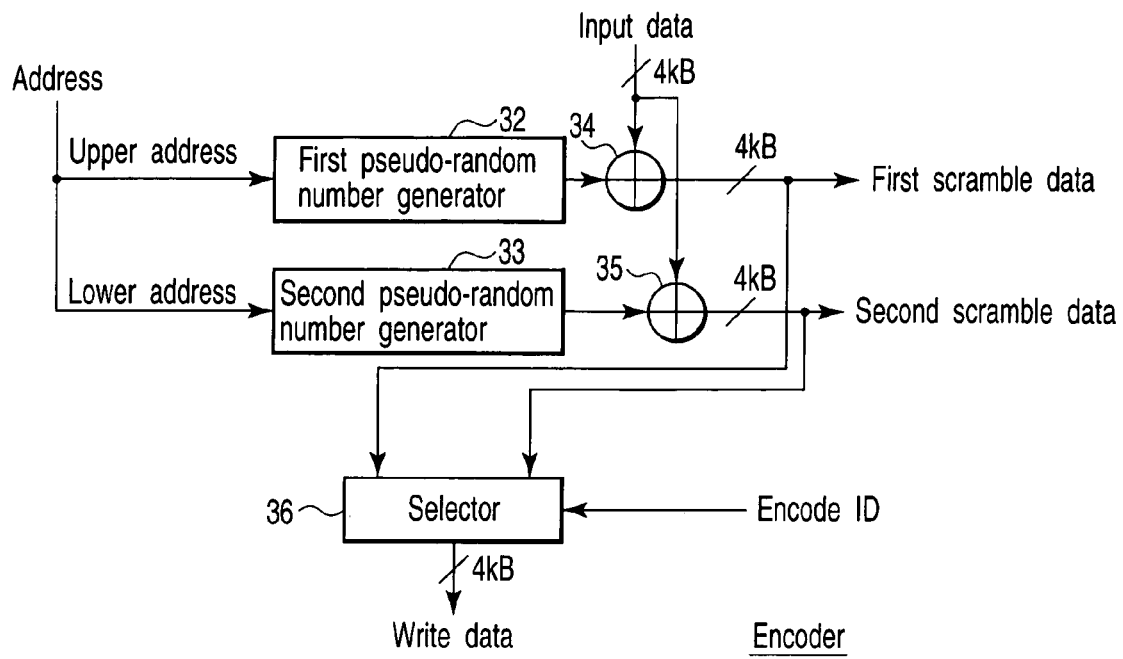
FIG. 12 is a block diagram showing an encoder according to a fourth embodiment.

Referring to FIG. 12, the encoder 21 includes a first pseudo-random number generator 32, a second pseudo-random number generator 33, XOR gates 34 and 35, and a selector 36.

The first pseudo-random number generator 32 generates a pseudo-random number based on an upper bit of an address (hereinafter referred to as upper address) of the write data. That is, the first pseudo-random number generator 32 generates the pseudo-random number while the upper address is set as a scramble seed. The second pseudo-random number generator 33 generates the pseudo-random number based on a lower bit of the address (hereinafter referred to as low address) of the write data. That is, the second pseudo-random number generator 33 generates the pseudo-random number while the lower address is set as the scramble seed. The first and second pseudo-random number generators 32 and 33 have similar configurations, and the first and second pseudo-random number generators 32 and 33 generate the same pseudo-random number when the same scramble seed is used.

The XOR gate 34 performs an exclusive OR operation of the input data and the pseudo-random number generated by the first pseudo-random number generator 32, and the XOR gate 34 outputs the operation result as first scramble data. The XOR gate 35 performs an exclusive OR operation of the input data and the pseudo-random number generated by the second pseudo-random number generator 33, and the XOR gate 35 outputs the operation result as second scramble data.

The selector 36 outputs one of the first and second pieces of scramble data as the write data according to the encode ID. Specifically, the selector 36 selects the first scramble data when the encode ID is "0", and the selector 36 selects the second scramble data when the encode ID is "1".

Figure 13:
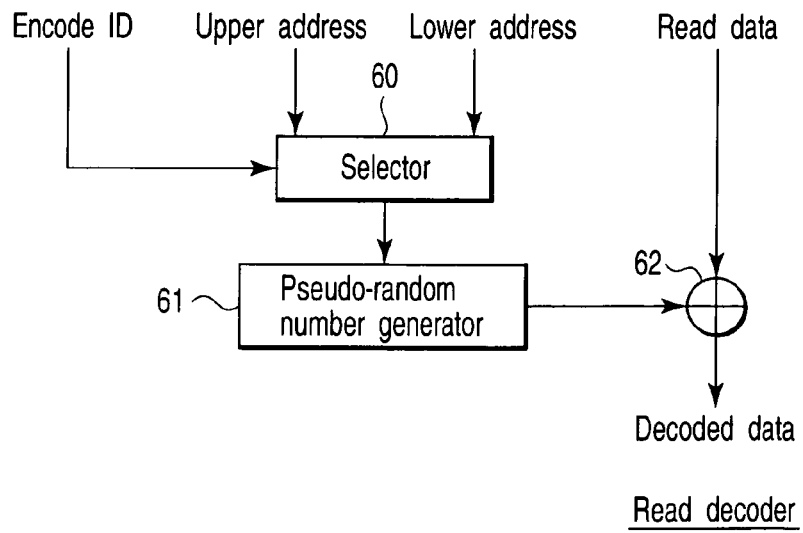
FIG. 13 is a block diagram showing a reading decoder of the fourth embodiment.

Referring to FIG. 13, the reading decoder 24 includes a selector 60, a pseudo-random number generator 61, and an XOR gate 62.

The selector 60 selects one of the upper address and the lower address according to the encode ID. Specifically, the selector 60 selects the upper address when the encode ID is "0", and the selector 36 selects the lower address when the encode ID is "1". The pseudo-random number generator 61 has a configuration similar to those of first and second pseudo-random number generators 32 and 33 in the encoder 21, and the pseudo-random number generator 61 generates a pseudo-random number while setting one of the upper address and the lower address selected by the selector 60 as the scramble seed. The XOR gate 62 performs an exclusive OR operation of the read data sensed and amplified by the sense amplifier 13 and the pseudo-random number generated by the pseudo-random number generator 61. The operation result in the XOR gate 62 becomes the decoded data.

The operation of the encoder 21 of the fourth embodiment is one in which the non-inverting value and the inverted value are replaced by the first and second pieces of scramble data respectively in the flowchart of the first embodiment of FIG. 4.

The operation of the cumulative value determination unit 22 of the fourth embodiment is one in which the non-inverting value and the inverted value are replaced by the first and second pieces of scramble data respectively in the flowcharts of the first to third embodiments of FIGS. 5, 7, 8, and 10.

The input data is scrambled according to different rules by the first and second pseudo-random number generators 32 and 33. The generated first and second pieces of scramble data are written as the write data in the NAND type flash memory 10.

The cumulative value determination unit 22 accumulates the first and second pieces of scramble data written in the NAND type flash memory 10. Each digit of the cumulative value corresponds to each bit line in the NAND type flash memory 10. The cumulative value determination unit 22 adds each digit of the cumulative value and each bit of the first scramble data, and the cumulative value determination unit 22 adds each digit of the cumulative value and each bit of the second scramble data. The cumulative value determination unit 22 selects the difference between the maximum value and the minimum value of each digit of the adding result in the first and second pieces of scramble data, or the cumulative value determination unit 22 selects one of the maximum value and the minimum value having the smaller standard deviation.

According to the memory system 1 of the fourth embodiment, the effect (5) is obtained in addition to the effects (1) to (4) described in the first to third embodiments.

(5) The operation reliability of the semiconductor storage device can be improved (Part 3).

In the memory system 1 of the fourth embodiment, the encoder 21 includes the linear feedback shift register, and the linear feedback shift register includes the first and second pseudo-random number generators 32 and 33 and the XOR gate 34 and 35. One of the first and second pieces of scramble data, obtained by performing the scramble on the input data using the linear feedback shift register, is written in the memory cell transistor MT.

That is, the data written in the NAND type flash memory 10 is randomized in the bit line direction based on which the first and second pieces of scramble data is selected. The scramble is performed using a pseudo-random number to randomize the data in the page. In other words, the data is also randomized in the word line direction.

Accordingly, the same pieces of data can be prevented from continuously existing not only in the bit line direction but also in the word line direction. As described in the effect (2) of the first embodiment, the problem of RD or PD can be reduced to improve the operation reliability of the NAND type flash memory.

In the fourth embodiment, the encoder 21 includes the two pseudo-random number generators. Alternatively, the encoder 21 may include the one pseudo-random number generator. In this case, the one pseudo-random number generator sets the upper address and the lower address as the scramble seed to generate the two pseudo-random numbers, and the two pseudo-random numbers are retained by the registers. Then, the exclusive OR operation of the pseudo-random number retained by the register and the input data is performed.

The encoder 21 may generate at least three pieces of scramble data. In this case, the one pseudo-random number generator may generate at least three random numbers, or at least three pseudo-random number generators may be provided.

Fifth Embodiment

A semiconductor device according to a fifth embodiment of the invention will be described. The fifth embodiment relates to the case in which each of the memory cell transistors MT retains four-value (2-bit) data in the first to third embodiments. Only the points different in the fifth embodiment will be described below.

Figure 14:
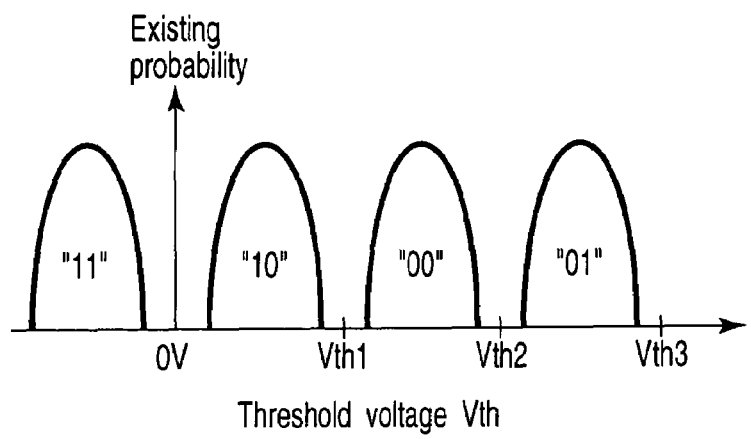
FIGS. 14 and 15 are graphs showing a threshold distribution of a memory cell transistor according to a fifth embodiment.

A threshold of the memory cell transistor MT of the fifth embodiment will be described with reference to FIG. 14. In FIG. 14, the horizontal axis indicates a threshold voltage Vth and the vertical axis indicates an existing probability of the memory cell.

As shown in FIG. 14, the memory cell MC can retain four pieces of data "11", "10", "00", and "01" in the ascending order of the threshold voltage Vth. The threshold voltage Vth is Vth<0V in the memory cell retaining the "11" data. The threshold voltage Vth is 0V<Vth<Vth1 in the memory cell retaining the "10" data. The threshold voltage Vth is Vth1<Vth<Vth2 in the memory cell retaining the "00" data. The threshold voltage Vth is Vth2<Vth<Vth3 in the memory cell retaining the "01" data.

Figure 15:
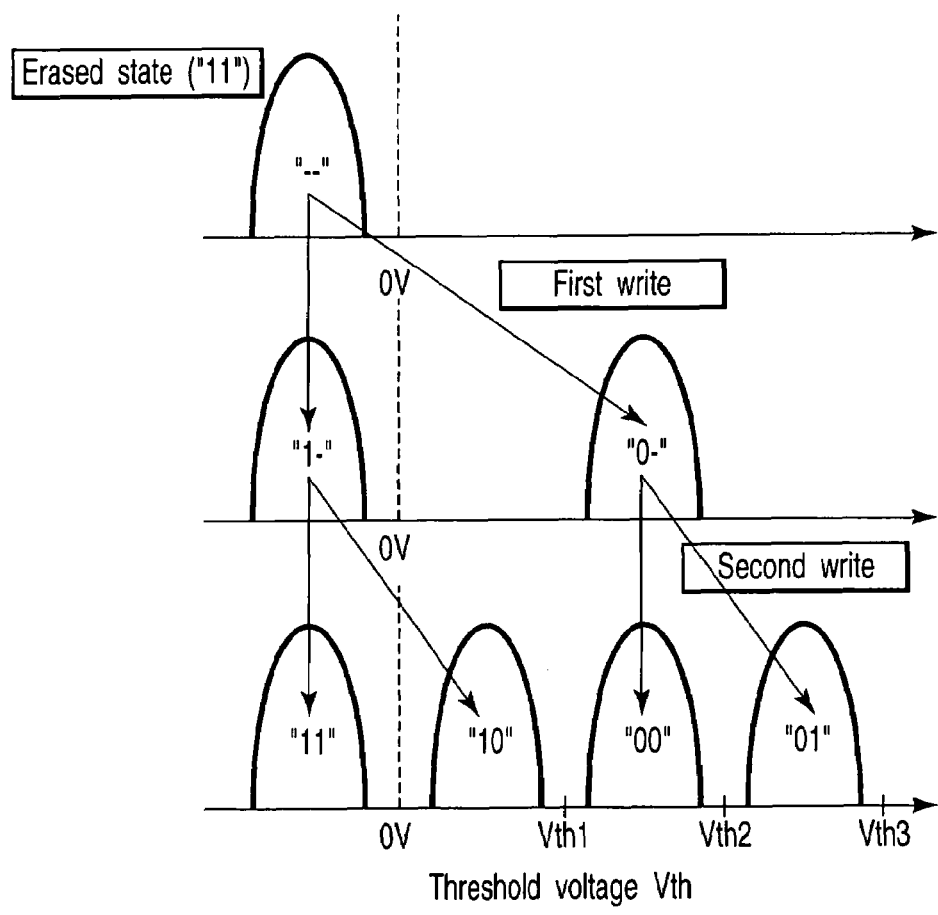

A method for writing four-value data in the memory cell MC will briefly be described with reference to FIG. 15. FIG. 15 shows a state of a change in threshold voltage Vth of the memory cell in writing the data. The pieces of data are collectively written for one page. The data write is performed while divided into a first write and a second write.

At the start of the write, the memory cells are in the erased state. That is, the memory cells have the negative threshold voltage Vth, and the memory cells retain the "11" data. In this state, the first write is performed. When the write data (first write data) is "1", electrons are not injected into the floating gate, the threshold voltage Vth is not changed. When the first write data is "0", electrons are injected into the floating gate, the threshold voltage Vth is changed toward the positive direction, and the threshold voltage Vth becomes Vth1<Vth<Vth2. That is, the memory cell has substantially the same threshold as that obtained in retaining the "00" data.

Then, the second write is performed. First the case in which the first write data is "1" will be described. When the second write data is "1", in the second write, electrons are not injected into the floating gate and the threshold voltage Vth is kept at a negative value. As a result, the "11" data is written in the memory cell. When the second write data is "0", electrons are injected into the floating gate, which changes the threshold voltage Vth to the positive direction. The threshold voltage Vth is 0V<Vth<Vth1. That is, the "10" data is written in the memory cell.

Next, the case in which the first write data is "0" will be described. When the second write data is "0", because electrons are not injected into the floating gate in the second write, the result of the first write is maintained. The threshold voltage Vth is Vth1<Vth<Vth2, and the "00" data is written in the memory cell. When the second write data is "1", electrons are further injected into the floating gate, which further changes the threshold voltage Vth to the positive direction. The threshold voltage Vth becomes Vth2<Vth<Vth3. That is, the "01" data is written in the memory cell.

Figures 16, 17:
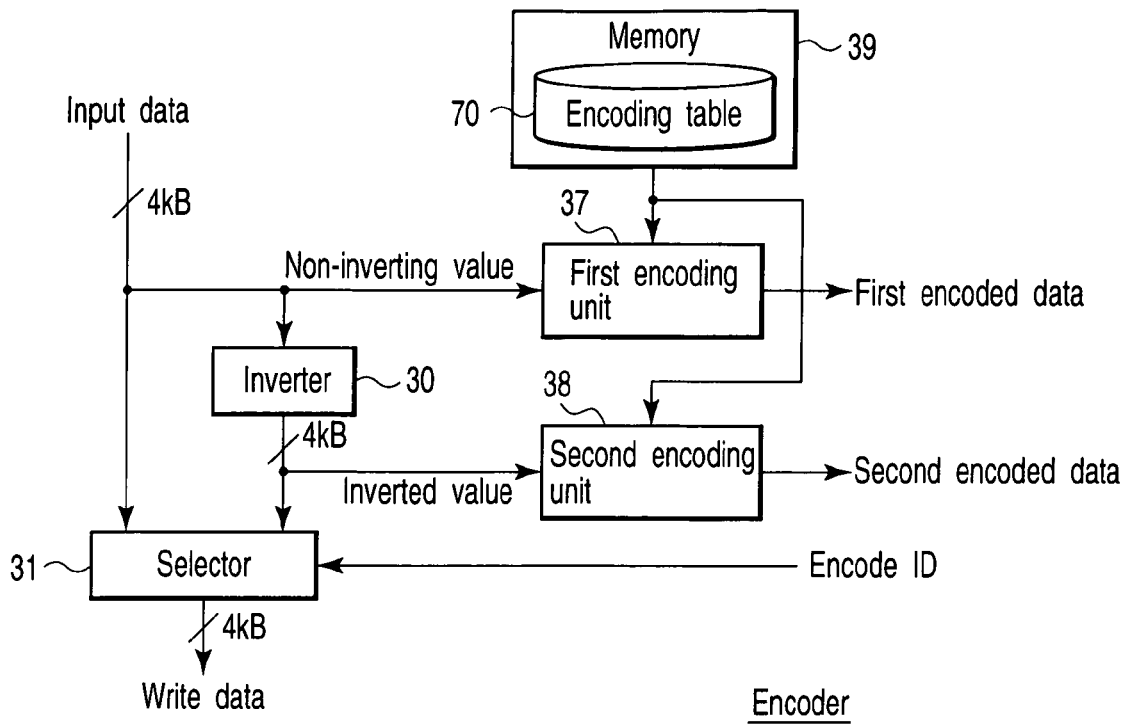
FIG. 16 is a block diagram showing an encoder of the fifth embodiment.
FIG. 17 is a conceptual view showing an encoding table of the fifth embodiment.

The configuration of the encoder 21 included in the memory controller 20 of the fifth embodiment will be described with reference to FIG. 16. Referring to FIG. 16, in addition to the configuration of the first embodiment of FIG. 3, the encoder 21 includes a first encoding unit 37, a second encoding unit 38, and a memory 39.

The memory 39 includes an encoding table 70. An example of the encoding table will be described with reference to FIG. 17. As shown in FIG. 17, the encoding table retains an accumulating code for the non-inverting value and the inverted value of the input data. "0", "1", "2", and "3" are allocated as the accumulating code in the descending order of the charge amount. The accumulating code becomes "0" when the non-inverting value or the inverted value is "01", the accumulating code becomes "1" when the non-inverting value or the inverted value is "00", the accumulating code becomes "2" when the non-inverting value or the inverted value is "10", and the accumulating code becomes "3" when the non-inverting value or the inverted value is "11".

The first encoding unit 37 encodes the non-inverting value to generate first encoding data according to the encoding table 70 of the memory 39, and the first encoding unit 37 outputs the first encoding data to the cumulative value determination unit 22. That is, the first encoding unit 37 outputs "0", "1", "2", and "3" as the first encoding data when the non-inverting value are "01", "00", "10", and "11" respectively.

The second encoding unit 38 encodes the inverted value to generate second encoding data according to the encoding table 70 of the memory 39, and the second encoding unit 38 outputs the second encoding data to the cumulative value determination unit 22. That is, the second encoding unit 38 outputs "0", "1", "2", and "3" as the second encoding data when the inverted value are "01", "00", "10", and "11" respectively.

Other configurations are similar to those of the first to third embodiments, therefore their descriptions are omitted.

The operation of the encoder 21 having the above-described configuration will be described with reference to FIG. 18.

Figure 18:
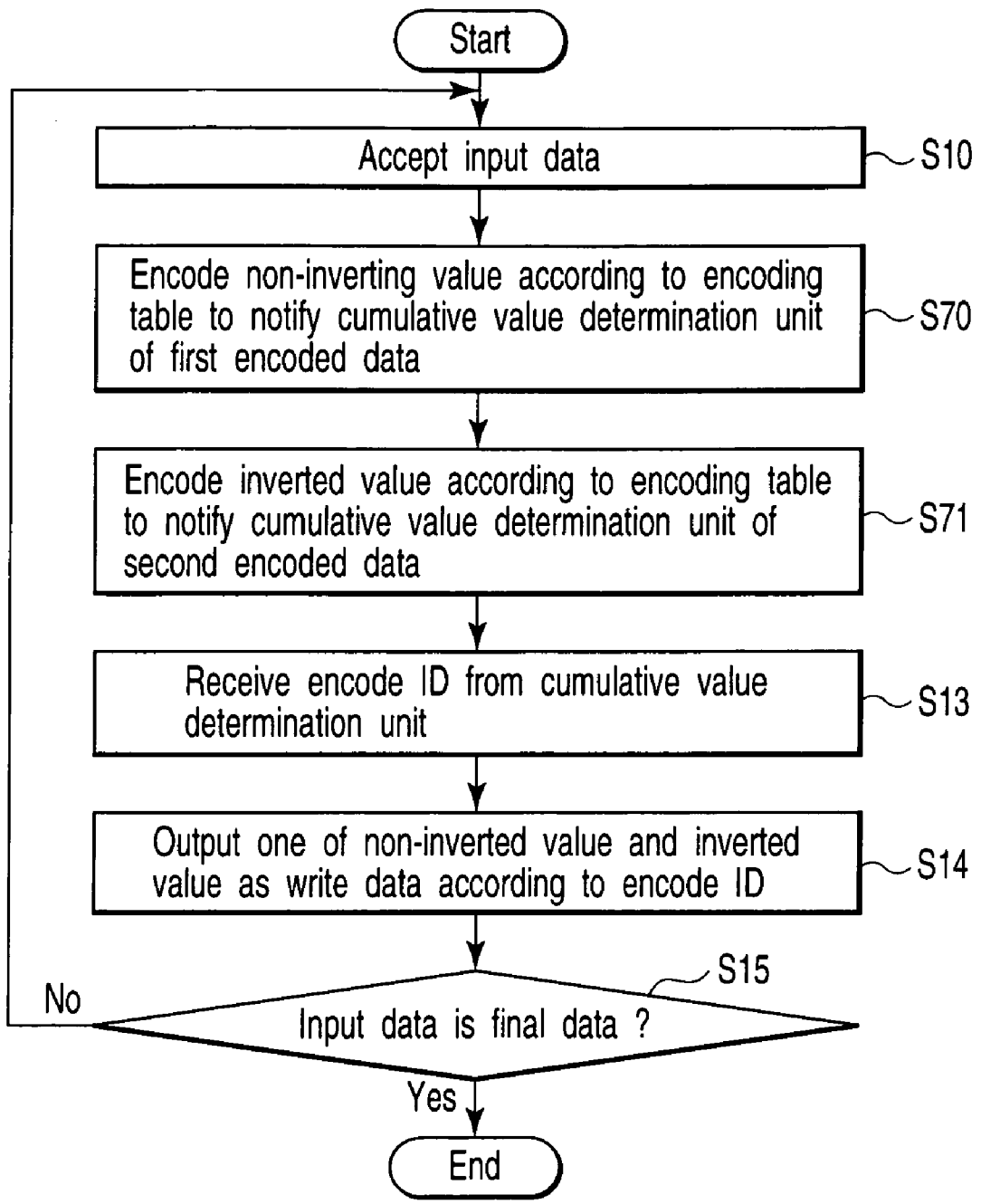
FIG. 18 is a flowchart showing processing performed in the encoder of the fifth embodiment.

Referring to FIG. 18, the encoder 21 accepts the one-page input data of the regular cell array 15 from the outside (Step S10). The first encoding unit 37 of the encoder 21 encodes the non-inverting value according to the encoding table 70, and the first encoding unit 37 notifies the cumulative value determination unit 22 of the resultant first encoding data (Step S70). At the same time, the second encoding unit 38 of the encoder 21 encodes the inverted value obtained by the inverter 30 according to the encoding table 70, and the second encoding unit 38 notifies the cumulative value determination unit 22 of the resultant second encoding data (Step S71). Then, the encoder 21 receives the encode ID from the cumulative value determination unit 22 (Step S13). The selector 31 of the encoder 21 outputs one of the non-inverting value and the inverted value as the write data to the NAND type flash memory 10 according to the encode ID (Step S14). When the input data is the final data (YES in Step S15), the processing is ended. When the input data is not the final data (NO in Step S15), the flow returns to Step S10.

Basically, the operation of the cumulative value determination unit 22 is one in which the non-inverting value and the inverted value are replaced by the first and second pieces of encoding data in the flowcharts of FIGS. 5, 7, 8, and 10 described in first to third embodiments.

Figure 19:
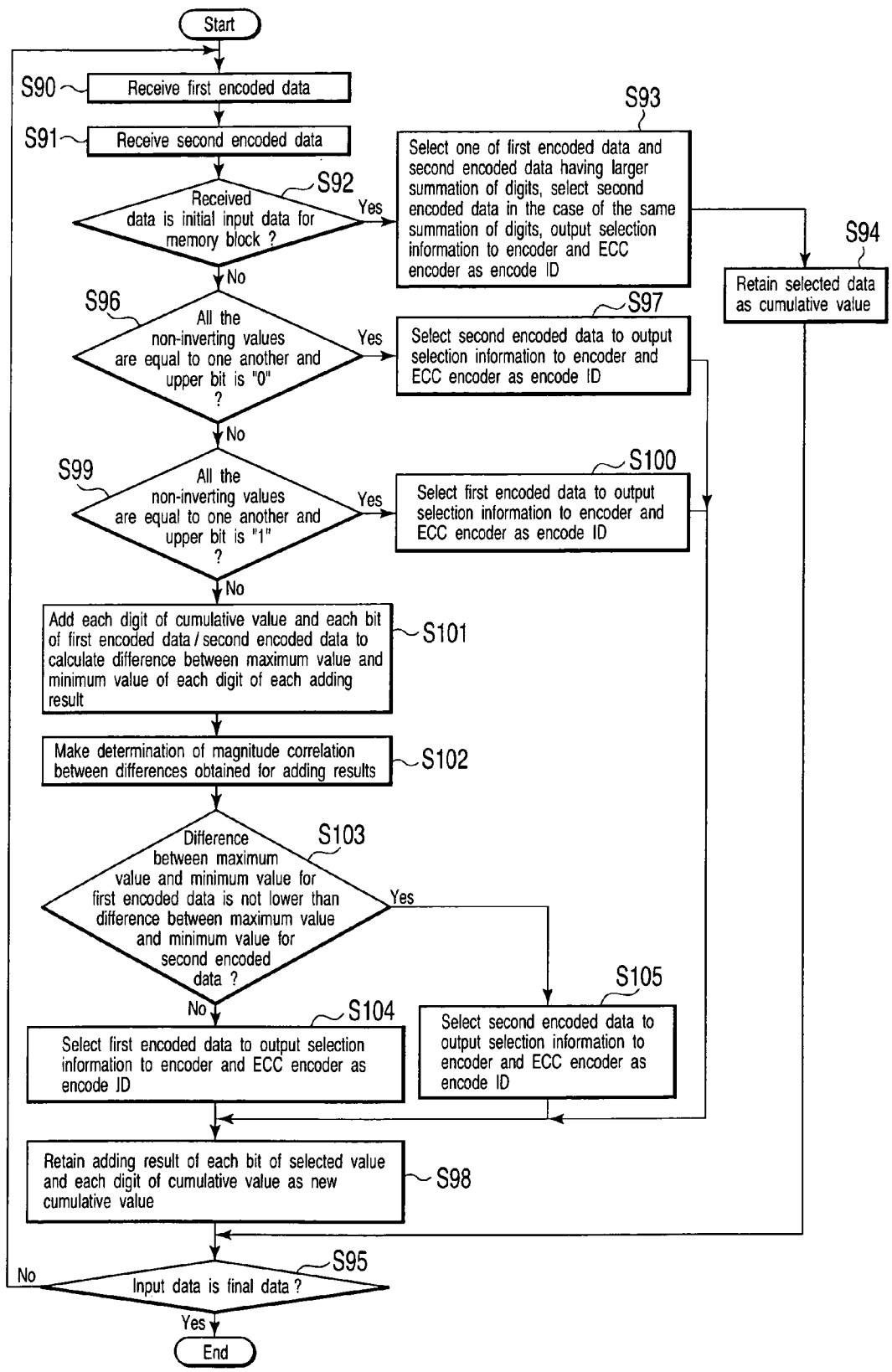
FIG. 19 is a flowchart showing processing performed in a cumulative value determination unit of the fifth embodiment.

Referring to FIG. 19, the cumulative value determination unit 22 receives the first piece of encoding data from the encoder 21 (Step S90), and the cumulative value determination unit 22 receives the second piece of encoding data from the encoder 21 (Step S91). When the received first and second pieces of encoding data correspond to the initial input data for the memory block 14 (YES in Step S92), the cumulative value determination unit 22 selects one of the first and second pieces of encoding data having more bits having the larger summation of the digits. When the non-inverting value is identical to the inverted value in the summation of the digits, the cumulative value determination unit 22 selects the second encoding data. The selection information is output as the encode ID to the encoder 21 and the ECC encoder 23 (Step S93). As a result, the write data output from the encoder 21 is written in the regular cell array 15, the ECC data and encode ID which are generated based on the write data are written in the ECC cell array 16. The cumulative value determination unit 22 retains one of the first and second pieces of encoding data selected in Step S93 as the cumulative value (Step S94). When the data which is selected in Step S93 and written in the memory cell MC is the final write data for the memory cell block 14 (YES in Step S95), the processing is ended. When the data is not the final write data (NO in Step S95), the flow returns to Step S90 to repeat the processing.

When the first and second pieces of encoding data are not the initial input data (NO in Step S92), the cumulative value determination unit 22 determines whether or not all the non-inverting values are equal to one another and the upper bit of the non-inverting value is "0". The determination whether or not all the non-inverting values are equal to one another can determine whether or not all the bits of the first encoding data have the same value. The determination of whether or not the upper bit is "0" may be made by inputting the non-inverting value into the cumulative value determination unit 22 aside from the first and second pieces of encoding data, or the cumulative value determination unit 22 may make the determination of whether or not the upper bit is "0" from the first encoding data based on the correlation shown in FIG. 17. When all the non-inverting values are equal to one another and the upper bit of the non-inverting value is "0" (YES in Step S96), the cumulative value determination unit 22 selects the second encoding data to output the selection information as the encode ID to the encoder 21 and the ECC encoder 23 (Step S97). Accordingly, in this case, the inverted value is written in the regular cell array 15. The cumulative value determination unit 22 retains the adding result of each bit of a selected value and each digit of the cumulative value owned by itself as the new cumulative value (Step S98). That is, after Step S97, the cumulative value retained by the cumulative value determination unit 22 at that time is updated by the value to which the second encoding data is further added. Then, the flow goes to Step S95.

When conditions of Step S96 are not satisfied (NO in Step S96), the cumulative value determination unit 22 determines whether or not all the non-inverting values are equal to one another and the upper bit of the non-inverting value is "1". When all the non-inverting values are equal to one another and the upper bit of the non-inverting value is "1" (YES in Step S99), the cumulative value determination unit 22 selects the first piece of encoding data to output the selection information as the encode ID to the encoder 21 and the ECC encoder 23 (Step S100). Accordingly, in this case, the non-inverting value is written in the regular cell array 15. Then, the flow goes to processing in Step S98. That is, after Step S100, the cumulative value retained by the cumulative value determination unit 22 at that time is updated by the value to which the first encoding data is further added. Then, the flow goes to Step S95.

When the conditions of Step S99 are not satisfied, namely, when all the non-inverting values are not equal to one another (NO in Step S99), the flow goes to the processing in Step S101. In Step S101, the cumulative value determination unit 22 adds each digit of the cumulative value owned by itself and each bit of the first and second pieces of encoding data received in Steps S90 and S91. The cumulative value determination unit 22 calculates the difference between the maximum value and the minimum value of each digit in each adding result of the first and second pieces of encoding data (Step S101). Then, the cumulative value determination unit 22 makes a determination of the magnitude relation of the difference obtained for each adding result of the first and second pieces of encoding data obtained in Step S101 (Step S102). When the difference between the maximum value and the minimum value of the adding result for the first encoding data is lower than the difference between the maximum value and the minimum value of the adding result for the second encoding data (NO in Step S103), the cumulative value determination unit 22 selects the first encoding data. The cumulative value determination unit 22 outputs the information indicating that the first encoding data is selected as the encode ID to the encoder 21 and the ECC encoder 23 (Step S104). That is, the non-inverting value is written in the regular cell array 15.

On the contrary, the cumulative value determination unit 22 selects the second encoding data, when the difference between the maximum value and the minimum value of the adding result for the first encoding data is not lower than the difference between the maximum value and the minimum value of the adding result for the second encoding data (YES in Step S103). The cumulative value determination unit 22 outputs the information indicating that the second encoding data is selected as the encode ID to the encoder 21 and the ECC encoder 23 (Step S105). That is, the inverted value is written in the regular cell array 15.

After Steps S104 and S105, the cumulative value determination unit 22 goes to the processing in Step 98.

A specific example of the processing will be described below with reference to FIG. 20. FIG. 20 is a table showing various signals used in the cumulative value determination unit 22, and FIG. 20 shows the first and second pieces of encoding data in addition to the pieces of information of FIG. 6. For the first and second pieces of encoding data and the cumulative value, "," is notated between the digits when one of the digits becomes "10" or more.

First, initial pieces of input data "01", "11", "10", and "11" are input to the encoder 21. In this case, the inverted values become "10", "00", "01", and "00". The first encoding data becomes "0323" and the second encoding data becomes "2101" according to the rule of FIG. 17. Because the input data is the initial data written in the memory block 14 (YES in Step S92), the cumulative value determination unit 22 goes to the processing in Step S93. In the first and second pieces of encoding data, the summation of the digits of the first encoding data "0323" becomes "8" and the summation of the digits of the second encoding data "2101" becomes "4". The cumulative value determination unit 22 selects the larger summation of the digits, i.e., the first encoding data "0323" (Step S93). The cumulative value becomes "0323" (Step S94).

Then, pieces of input data "00", "01", "10", and "00" are input to the encoder 21. In this case, the inverted values become "11", "10", "10", and "11". The first and second pieces of encoding data become "1021" and "3203" respectively. The pieces of input data "00", "01", "10", and "00" are not the initial data (NO in Step S92), and all the non-inverting values are not equal to one another (NO in Step S96, NO in Step S99). Therefore, the cumulative value determination unit 22 adds each digit of the cumulative value and each bit of the first and second pieces of encoding data (Step S101). Then, at this point, because the cumulative value is "0323", the adding result of the cumulative value and the first encoding data becomes "1344". The adding result of the cumulative value and the second encoding data becomes "3526". The difference between the maximum value and the minimum value "3" of each digit of the adding result of the cumulative value and the first encoding data is lower than the difference between the maximum value and the minimum value "4" of each digit of the adding result of the cumulative value and the second encoding data (NO in Step S103). Accordingly, the cumulative value determination unit 22 selects the first encoding data "1344" to set the encode ID to "0". The cumulative value determination unit 22 retains the adding result "1344" for the first encoding data as the new cumulative value (Step S98). When "0" is set as the encode ID, the selector 31 of the encoder 21 selects the non-inverting value to output the non-inverting values "00", "01", "10", and "00" as the write data.

The processing similar to that of the input number "2" is performed on the input numbers "3" and "4".

Next, the input number "5" will be described. Fifth pieces of input data are "11", "11", "11", and "11". In this case, the inverted values become "00", "00", "00", and "00" respectively. The first and second pieces of encoding data become "3333" and "1111" respectively. The pieces of input data "11", "11", "11", and "11" are not the initial data (NO in Step S92), the non-inverting values are equal to one another, and the upper bit of the non-inverting value is "1" (NO in Step S96 and YES in Step S99). Accordingly, the cumulative value determination unit 22 selects the first encoding data "3333" (Step S100). Then, at this point, because the cumulative value is "7665", the adding results "10", "9", "9", and "8" of the cumulative value "7665" and the first encoding data "3333" becomes the new cumulative value (Step S98).

Next, the input number "6" will be described. Sixth pieces of input data are "00", "00", "00", and "00". In this case, the inverted values become "11", "11", "11", and "11" respectively. The first and second pieces of encoding data become "1111" and "3333" respectively. The pieces of input data "00", "00", "00", and "00" are not the initial data (NO in Step S92), the non-inverting values are equal to one another, and the upper bit of the non-inverting value is "0" (YES in Step S96). Accordingly, the cumulative value determination unit 22 selects the second encoding data "3333" to set the encode ID to "1". Then, the cumulative value determination unit 22 retains the adding results "13", "12", "12", and "11" as the new cumulative value for the second encoding data (Step S97). When the encode ID is set to "1", the selector 31 of the encoder 21 selects the inverted value to output the inverted values "11", "11", "11", and "11" as the write data.

Thus, in the memory system of the fifth embodiment, the first and second encoding units 37 and 38 encode the multi-bit data according to the charge amount of the multi-bit data. More specifically, the encoding value is increased in the ascending order of the charge amount injected into the floating gate when the multi-bit data is written (see FIG. 17). The cumulative value is calculated using this encoding data. Accordingly, even in the NAND type flash memory 10 including the memory cell transistor MT which can retain the multi-bit data, the effects (1) and (2) described in the first embodiment are obtained. Additionally, when the configurations of the second and third embodiments are used, similarly the effects (3) and (4) are obtained.

Figure 21:
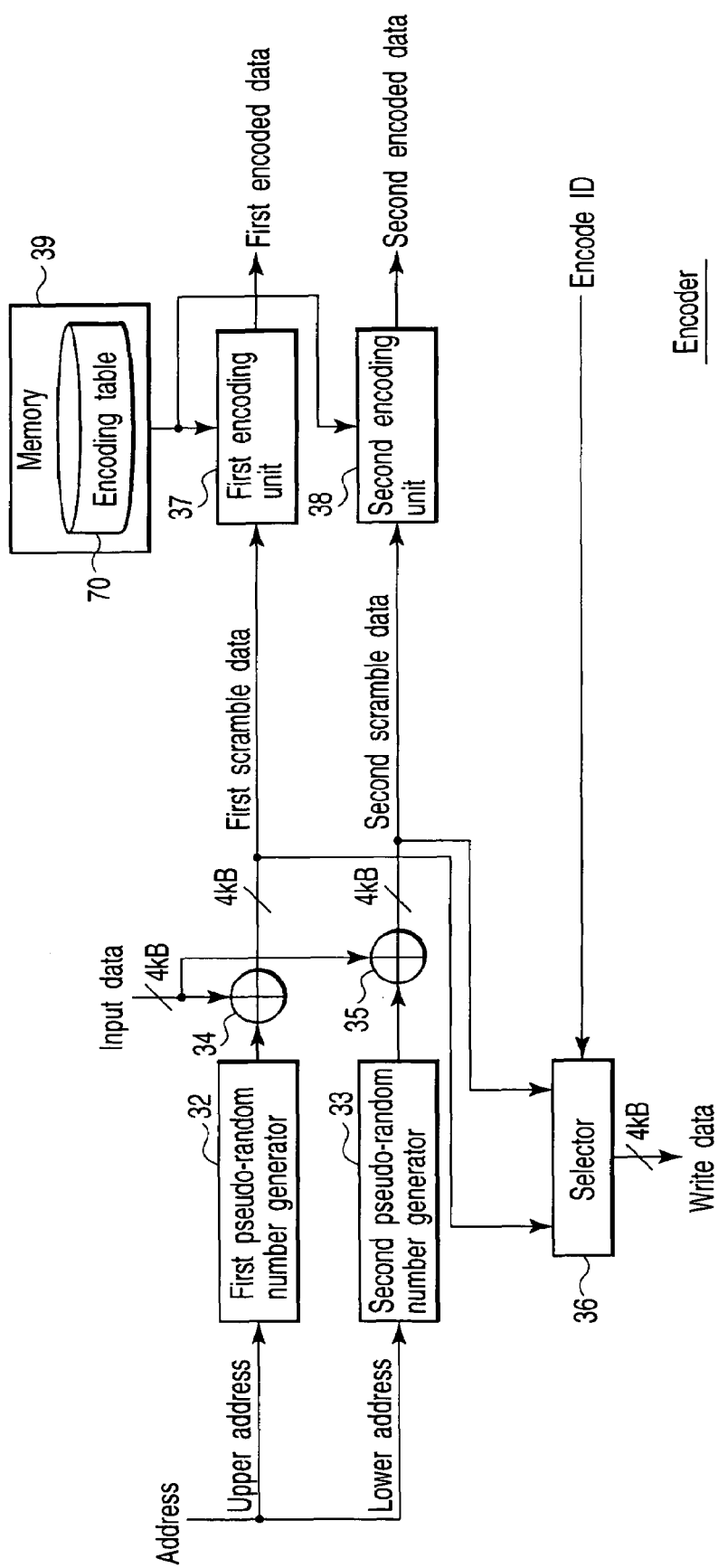
FIG. 21 is a block diagram showing an encoder according to a modification of the fifth embodiment.

The fifth embodiment can be combined with the fourth embodiment. Referring to FIG. 21, in addition to the configuration of the fourth embodiment of FIG. 12, the encoder 21 includes a first encoding unit 37, a second encoding unit 38, and a memory 39. The first and second encoding units 37 and 38 encode first and second pieces of scramble data output from the XOR gates 34 and 35 according to the encoding table 70 respectively, and the first and second encoding units 37 and 38 output the encoded result as the first and second pieces of encoding data to the cumulative value determination unit 22. In this case, the encoding table 70 of the memory 39 retains the relationship between the first and second pieces of scramble data and the accumulating code. According to the modification of the fifth embodiment, the effect (5) described in the fourth embodiment is obtained.

Sixth Embodiment

A semiconductor device according to a sixth embodiment of the invention will be described. The sixth embodiment relates to another coding method of the fifth embodiment. Only the different points in the sixth embodiment will be described below.

Figures 22, 23:
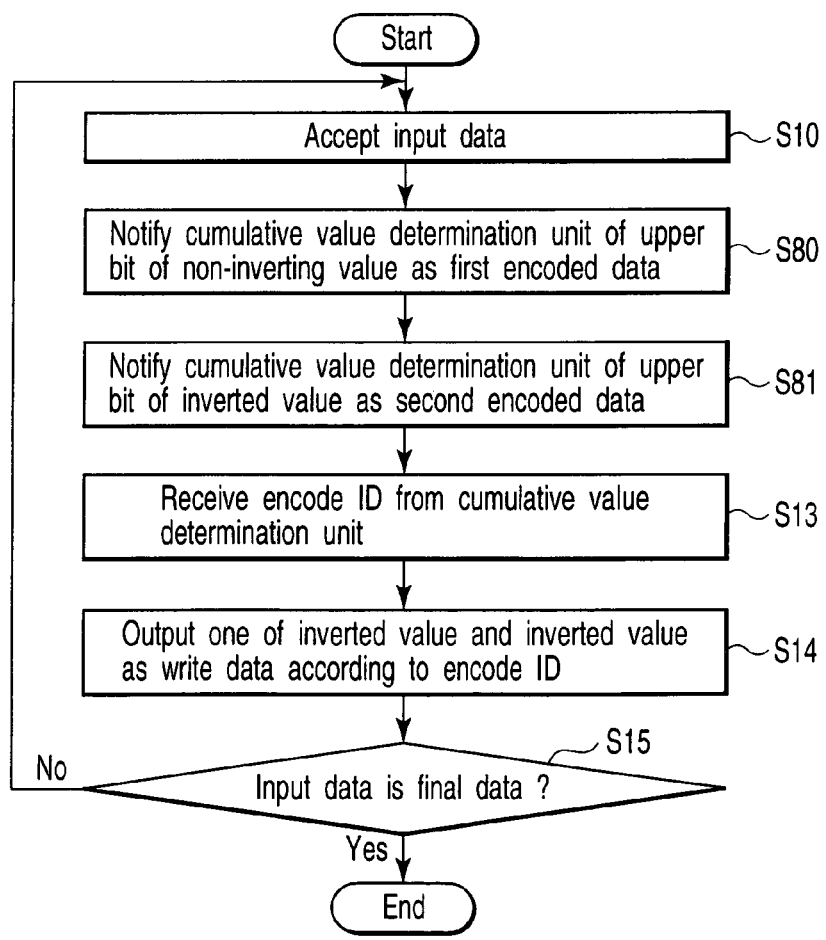
FIG. 22 is a conceptual view showing an encoding table according to a sixth embodiment.
FIG. 23 is a flowchart showing processing performed in an encoder of the sixth embodiment.

FIG. 22 is a conceptual view showing an encoding table 70 included in the memory 39 of the encoder 21 of the sixth embodiment. As shown in FIG. 22, the accumulating code becomes "0" when the non-inverting value or the inverted value is "01" and "00", and the accumulating code becomes "1" when the non-inverting value or the inverted value is "10" and "11". That is, the upper bits of the non-inverting value and inverted value become the first and second pieces of encoding data.

The operation of the encoder 21 will be described with reference to FIG. 23.

Referring to FIG. 23, the encoder 21 accepts the one-page input data of the regular cell array 15 from the outside (Step S10). The first encoding unit 37 of the encoder 21 notifies the cumulative value determination unit 22 of the upper bit of the non-inverting value as the first encoding data according to the encoding table 70 (Step S80). At the same time, the second encoding unit 38 of the encoder 21 notifies the cumulative value determination unit 22 of the upper bit of the inverted value obtained by inverter 20 as the second encoding data according to the encoding table 70 (Step S81). Then, the processing from Step S13 is performed. The operation of the cumulative value determination unit 22 is similar to that of the fifth embodiment.

Thus, in the memory system of the sixth embodiment, the effects (1) to (4) are obtained like the fifth embodiment. The following effect (6) is additionally obtained.

(6) The size of the memory controller 20 can be reduced (Part 3).

In the configuration of the sixth embodiment, the first and second encoding units 37 and 38 output the upper bits of the non-inverting value and the inverted value as the first and second pieces of encoding data. Accordingly, when the input data is the two-bit data, the first and second pieces of encoding data have the available values of "0" and "1". Therefore, the cumulative value can be decreased compared with the fifth embodiment. Specifically, in the case of 32 word lines in the fifth embodiment, the available maximum value of each digit of the cumulative value is ("3"×32)="96". On the other hand, in the sixth embodiment, the available maximum value of each digit of the cumulative value is ("1"×32)="32". Therefore, the size of the register retaining the cumulative value can be reduced to achieve downsizing of the memory controller 20.

In the above description, the encoder 21 retains the encoding table 70 in the memory 39. However, the encoding table 70 is not required as long as the first and second encoding units 37 and 38 can take out the upper bits of the non-inverting value and the inverted value. Similarly to the fifth embodiment, in the sixth embodiment, the first and second pieces of scramble data may be input to the first and second encoding units 37 and 38 instead of the non-inverting value and the inverted value.

Seventh Embodiment

A semiconductor device according to a seventh embodiment of the invention will be described. The seventh embodiment relates to a configuration in which the page data is randomized in the word line direction while the charge amount among the bit lines is not averaged by the cumulative value.

Figure 24:
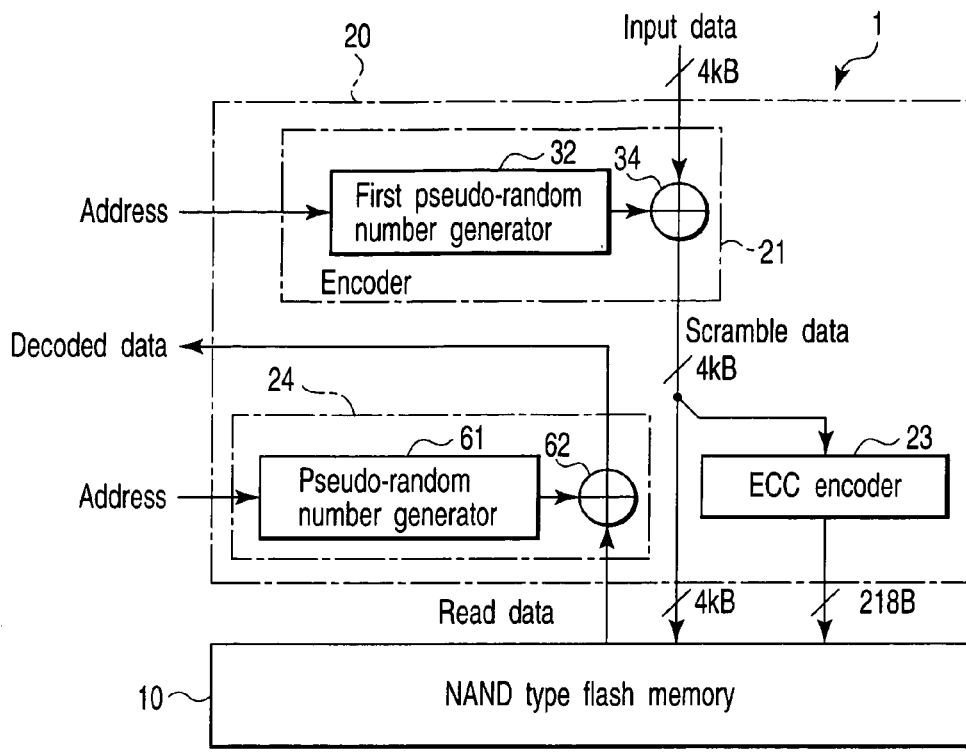
FIG. 24 is a block diagram showing a memory system according to a seventh embodiment.

Referring to FIG. 24, the memory system 1 of the seventh embodiment has the configuration in which the cumulative value determination unit 22 is eliminated from the configuration of the first embodiment of FIG. 1. The NAND type flash memory 10 has the same configuration as the first embodiment.

The encoder 21 of the seventh embodiment as the configuration in which the second pseudo-random number generator 33, the XOR gate 35, and the selector 36 are eliminated in the configuration of the fourth embodiment of FIG. 12. The first pseudo-random number generator 32 generates the pseudo-random number while the address of the write data is used as the scramble seed. At this point, the upper address or lower address of the address of the write data and any data concerning the address of the write data may be used as the scramble seed. The XOR gate 34 performs the exclusive OR operation of the input data and the pseudo-random number generated by the first pseudo-random number generator 32. The operation result performed by the XOR gate 34 is written as the scramble data in the NAND type flash memory 10.

The ECC encoder 23 generates the ECC data based on the scramble data output from the XOR gate 34.

The reading decoder 24 has the configuration in which the selector 60 is eliminated from the configuration of the fourth embodiment of FIG. 13. The pseudo-random number generator 61 generates the pseudo-random number while the address of the write data used in the encoder is used as the scramble seed. The XOR gate 62 performs the exclusive OR operation of the read data and the pseudo-random number generated by the pseudo-random number generator 61. The operation result in the XOR gate 62 becomes the decoded data.

According to the memory system 1 of the seventh embodiment, the following effect (7) is obtained.

(7) The effects (1) and (5) are obtained by the simple configuration.

In the configuration of the seventh embodiment, the input data is scrambled by the pseudo-random number generated by the pseudo-random number generator 32, and the scrambled data is written in the NAND type flash memory 10. That is, the write data is randomized in the word line direction. Accordingly, the same pieces of data can be prevented from continuously existing along the word line direction, and the effect (5) described in the fourth embodiment is obtained.

The input data is scrambled by the pseudo-random number, which averages the charge amount among the bit lines. Accordingly, the effect (1) described in the first embodiment is obtained. Obviously, for averaging the charge amount, the method of the first embodiment for selecting the write data based on the cumulative value of the charge amount of the bit line is superior to the method of the seventh embodiment. On the other hand, the cumulative value determination unit 22 and the selector 31 of the encoder 21 are not required in the seventh embodiment. Accordingly, in the case where a simple circuit configuration is strongly demanded, it is desirable to adopt the configuration of the seventh embodiment. In the seventh embodiment, because the encode ID is not used, the memory cell transistor MT connected to the bit line BL4313 in the ECC cell array 16 can be used to retain the ECC data.

In the semiconductor devices of the first to sixth embodiment, the cumulative value determination unit 22 of the memory controller 20 retains the cumulative value in which each digit is the accumulating result of the charge amount in each bit line. As the value of each digit of the cumulative value is increased, the charge amount in the corresponding bit line is decreased. As the value of each digit is decreased, the charge amount is increased. The cumulative value determination unit 22 selects the write data such that the difference among the digits of the cumulative value is decreased, i.e., averaged. As a result, the charge amounts are averaged among the bit lines, and the problem of PD or RD can be solved to improve the operation reliability of the semiconductor device. In the seventh embodiment, the same effect is also obtained by randomizing the write data in the word line direction.

Both the case in which the encoder 21 outputs the non-inverting value and the inverted value and the case in which the first and second pieces of scramble data are output are described in the above embodiments. Alternatively, both the cases may be combined.

Figure 25:
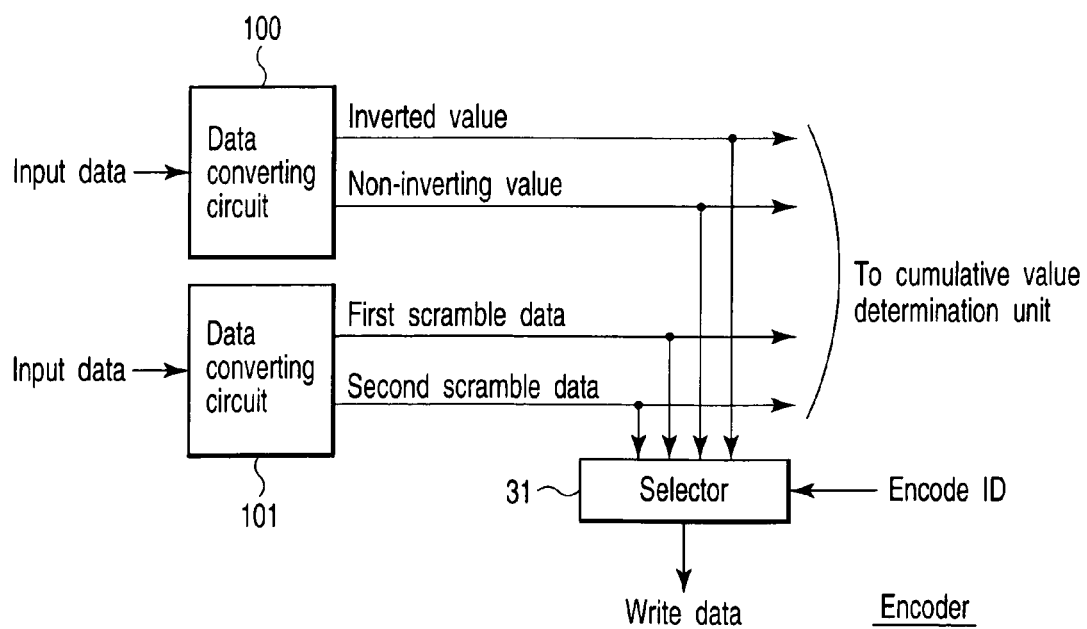
FIGS. 25 and 26 are block diagrams showing encoders according to first and second modifications of the first to sixth embodiment.

Referring to FIG. 25, the encoder 21 includes data converting circuits 100 and 101 and the selector 31. The data converting circuit 100 includes the inverter 30 described in the first embodiment, and the data converting circuit 100 outputs the inverted value and non-inverting value based on the input data. The data converting circuit 101 includes the linear feedback register described in the fourth embodiment, and the data converting circuit 101 outputs the first and second pieces of scramble data based on the input data. The selector 31 selects one of the non-inverting value, the inverted value, and the first and second pieces of scramble data according to the encode ID.

In this case, the cumulative value determination unit 22 adds each bit of the cumulative value and each bit of the inverted value, each bit of the non-inverting value, and each bit of the first and second pieces of scramble data. The cumulative value determination unit 22 selects one of the inverted value, the non-inverting value, and the first and second pieces of scramble data in which the difference between the maximum value and the minimum of each digit of the adding result becomes the minimum. Thus, the four pieces of data may be set to the write candidate to select the optimum data.

Figure 26:
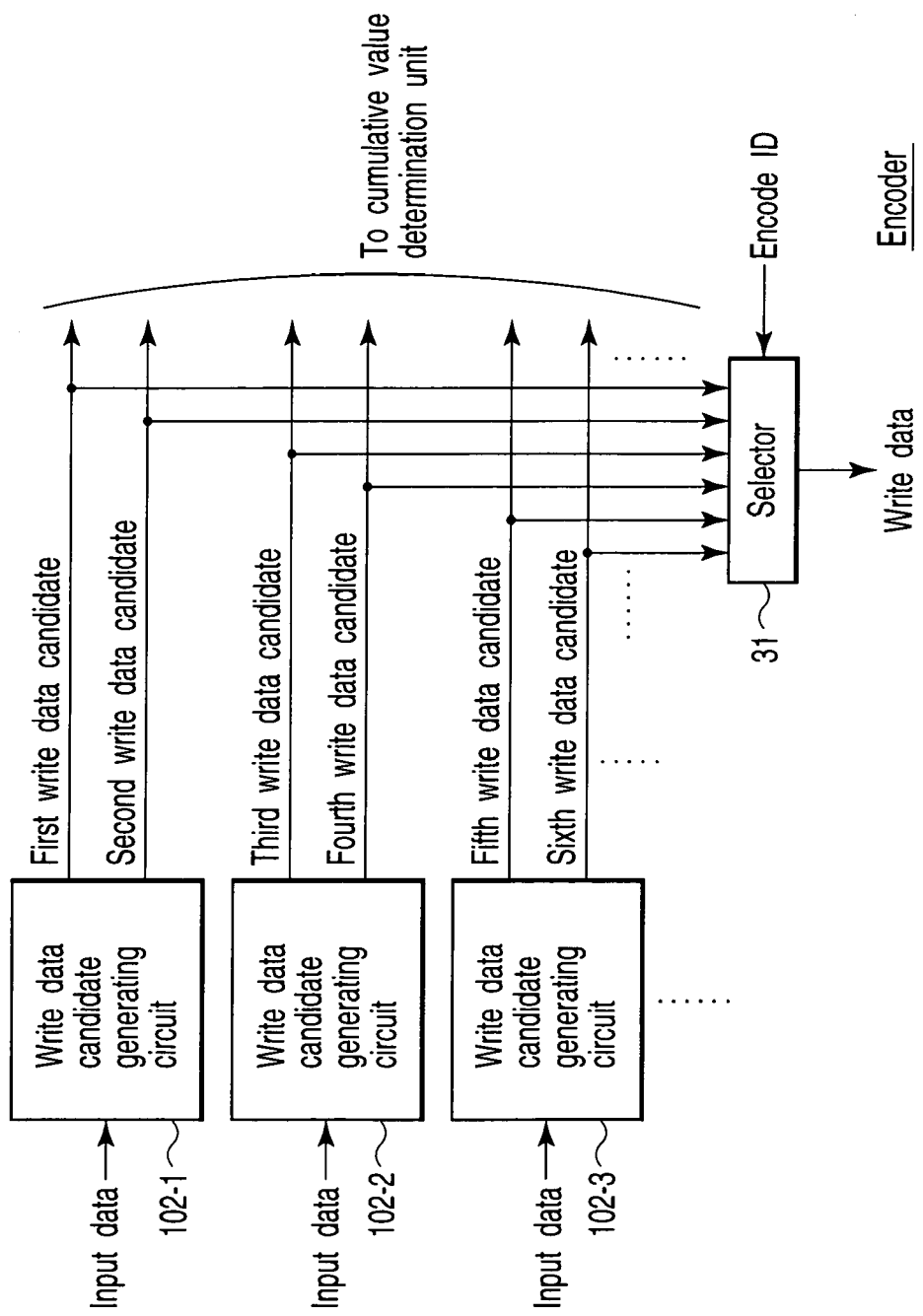

Accordingly, the encoder 21 in the first to sixth embodiments can be represented by a configuration of FIG. 26. Referring to FIG. 26, the encoder 21 includes k (k is a natural number) write data candidate generating circuits 102-1 to 102-k and the selector 31. For example, the write data candidate generating circuits 102-1 to 102-k are formed by the inverter 30 described in the first embodiment or the linear feedback register described in the fourth embodiment. The write data candidate generating circuits 102-1 to 102-k generate the 1st to 2 k-th write data candidates. The data candidates correspond to the non-inverting value, the inverted value, and the first and second pieces of scramble data. The selector 31 selects one of the first and second k write data candidates as the write data according to the encode ID.

In this case, the cumulative value determination unit 22 adds each bit of the cumulative value and each bit of each of the 1st to 2 k-th write data candidates. The cumulative value determination unit 22 selects one of the 1st to 2 k-th write data candidates in which the difference between the maximum value and the minimum of each digit of the adding result becomes the minimum.

Figure 27:
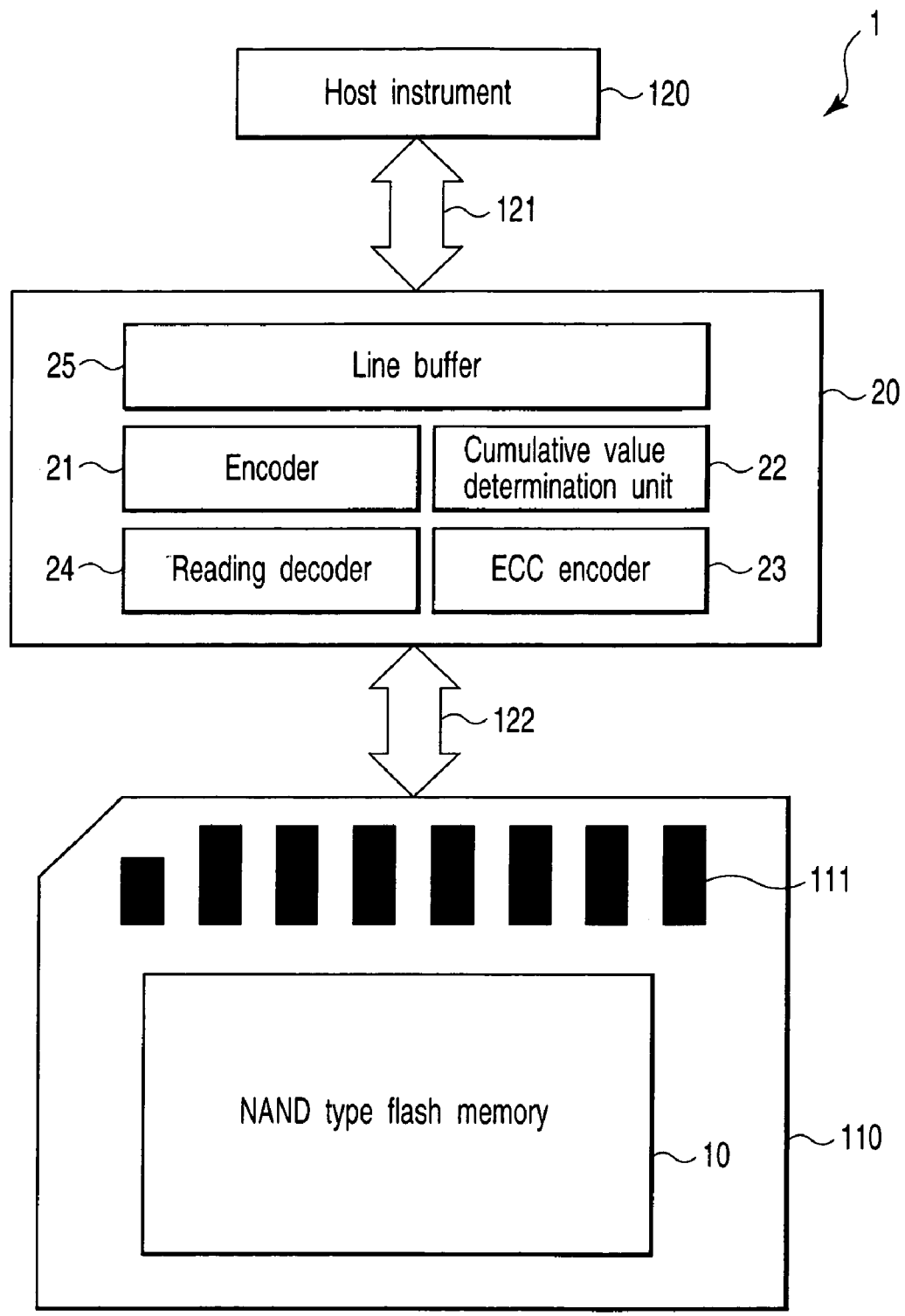

The above embodiments can be applied to various NAND type flash memory devices. The case in which the first to seventh embodiments are applied to a memory card will be described below. FIG. 27 is a block diagram of the memory system 1.

Referring to FIG. 27, the memory system 1 includes a memory card 110, the memory controller 20, and a host instrument 120. The host instrument 120 includes hardware and software for accessing the memory controller 20 connected through a bus interface 121. As described in the first to seventh embodiments, the memory controller 20 includes the encoder 21, the cumulative value determination unit 22, the ECC encoder 23, and the reading decoder 24. The memory controller 20 further includes a line buffer 25.

The memory card 110 is connected to the memory controller 20 through a bus interface 122. The memory card 110 includes the NAND type flash memory 10 described in the first embodiment and a plurality of signal pins 111. The signal pin 111 can electrically be connected to the memory controller 20. The electric power and various signals are given from the memory controller 20 through the signal pins 111.

In the above configuration, the bus interfaces 121 and 122 have eight-bit data lines. In the case where one-page (4096 bytes) data is written, the one-page data is transferred 4096 times while divided into each eight bits. The line buffer 25 of the memory controller 20 is used to perform buffering of the transfer data. The one-page data buffered by the line buffer 25 is input to the encoder 21. Thus, the processing described in the first to seventh embodiments may be performed outside the memory card 110.

FIG. 28 is a block diagram of the memory system 1 showing an example of another memory card. Referring to FIG. 28, the memory system 1 includes a memory card 130 and the host instrument 120. The host instrument 120 is connected to the memory card 130 through a bus interface 123. The memory card 130 includes the memory controller 20 described in the first to seventh embodiments, the NAND type flash memory 10, and a plurality of signal pins 131. The electric power and various signals are given from the host instrument 120 through the signal pins 131.

In this case, the processing described in the first to seventh embodiments and the generation of the ECC data are performed inside the memory card 130. The write data and the ECC data is transferred to the page buffer 12 of the NAND type flash memory 10 though an internal bus connecting the memory controller 20 and the NAND type flash memory 10. Similarly to the case of FIG. 27, the transfer is performed in each eight bits, and the write data is transferred 4096 times while divided when the 4096 bytes is written.

FIGS. 27 and 28 show the examples of the memory card. The embodiment is not limited to the memory card, but the invention can be applied to the various kinds of the NAND type flash memories. The embodiment is not limited to the NAND type flash memory, but the embodiment can be applied to other semiconductor memories in which a similar problem is generated.

In the above embodiments, the cumulative value is described as the cumulative result of the "1" data. Alternatively, the cumulative value may be the cumulative result of the "0" data. That is, the absolute value of the cumulative value has no meaning, and it is only necessary to know the difference in charge amount between the digits of the cumulative value. In the fifth embodiment, each memory cell retains the two-bit data (four values). Alternatively, each memory cell may retain the data having at least three bits (eight values). In such cases, the data can be dealt with by the same methods as that of FIG. 19. However, originally the processing in Steps S96 and S99 of FIG. 19 is used to reduce the charge amount of the memory cell in the case where the pieces of page data are equal to one another. Accordingly, no particular problem is generated if the data is "0" or "1", but it is necessary to select one of the non-inverting value and the inverted value of the input data which has the smaller charge amount. Thus, the concept that the data having the smaller charge amount is selected also holds in the processing in Step S93, and the same concept can hold in Steps S23, S26, and S29 of the first to fourth embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory controller which controls a semiconductor storage device including nonvolatile memory cells, the controller comprising:
    a generating circuit which generates a plurality of first data based on a second data to be collectively written in the memory cells, the second data having multi-bit; and
    a selection circuit which retains a cumulative value whose each digit is a cumulative result in each bit of data which is already written in the memory cells, the selection circuit selecting one of the plurality of first data, a selected first data having a better average of digits in a sum of each bit of the selected first data and each digit of the cumulative value than an unselected first data, the selection circuit retaining the sum concerning the selected first data as the new cumulative value.

2. The controller according to claim 1, wherein the selected first data and information indicating the selected first data is collectively written in the memory cells connected to a same word line.

3. The controller according to claim 1, wherein the generating circuit generates a plurality of third data based on the second data, and the generating circuit generates the first data by encoding the third data according to a charge amount charged in the memory cells by each of the third data, and
    one of the third data corresponding to the selected first data and information indicating the selected first data is collectively written in the memory cells connected to a same word line.

4. The controller according to claim 1, wherein the generating circuit includes an inverting circuit which inverts each bit of the second data, and the generating circuit outputs the non-inverting second data and the second data whose each bit is inverted by the inverting circuit as the first data.

5. The controller according to claim 1, wherein the generating circuit includes:
    a creating circuit which creates a plurality of pseudo-random numbers; and
    a logic gate which calculates an exclusive OR of each of the plurality of pseudo-random numbers and each bit of the second data to output a calculation result as the first data.

6. The controller according to claim 1, wherein the selection circuit selects one of the first data, in which a difference between a maximum value and a minimum value of each digit in the sum becomes a minimum.

7. The controller according to claim 1, wherein the selection circuit selects one of the first data, in which a standard deviation of each digit in the sum becomes a minimum.

8. The controller according to claim 1, wherein the selection circuit sets a result obtained by subtracting "1" from each digit of the sum to the new cumulative value when all the digits of the sum are at least "1" for the selected first data.

9. The controller according to claim 1, wherein, when one of the digits of the sum generates an overflow, the selection circuit replaces a value of the digit in which the overflow is generated by a quotient of "2" of a maximum value which is countable in the digit, and the selection circuit replaces each of other digits by the quotient of "2".

10. A semiconductor device comprising:
    a memory controller recited in claim 1; and
    the semiconductor storage device which includes a first memory region and a second memory region, the memory cells being arranged in each of the first memory region and the second memory region, data corresponding to the first data selected by the selection circuit of the memory controller being written in the memory cells of the first memory region, the information indicating the selected first data being written in the memory cells of the second memory region.

11. The device according to claim 10, wherein the selected first data and information indicating the selected first data is collectively written in the memory cells connected to a same word line of the first and second memory regions, respectively.

12. The device according to claim 10, wherein the generating circuit generates a plurality of third data based on the second data, and the generating circuit generates the first data by encoding the third data according to a charge amount charged in the memory cells by each of the third data, and
    one of the third data corresponding to the selected first data and information indicating the selected first data is collectively written in the memory cells connected to a same word line of the first and second memory regions, respectively.

13. The device according to claim 10, wherein the generating circuit includes an inverting circuit which inverts each bit of the second data, and the generating circuit outputs the non-inverting second data and the second data whose each bit is inverted by the inverting circuit as the first data.

14. The device according to claim 10, wherein the generating circuit includes:
    a creating circuit which creates a plurality of pseudo-random numbers; and
    a logic gate which calculates an exclusive OR of each of the plurality of pseudo-random numbers and each bit of the second data to output a calculation result as the first data.

15. The device according to claim 10, wherein the selection circuit selects one of the first data, in which a difference between a maximum value and a minimum value of each digit in the sum becomes a minimum.

16. The device according to claim 10, wherein the selection circuit selects one of the first data, in which a standard deviation of each digit in the sum becomes a minimum.

17. The device according to claim 10, wherein the selection circuit sets a result obtained by subtracting "1" from each digit of the sum to the new cumulative value when all the digits of the sum are at least "1" for the selected first data.

18. The device according to claim 10, wherein, when one of the digits of the sum generates an overflow, the selection circuit replaces a value of the digit in which the overflow is generated by a quotient of "2" of a maximum value which is countable in the digit, and the selection circuit replaces each of other digits by the quotient of "2".

19. A memory controller which controls a semiconductor storage device including nonvolatile memory cells, the controller comprising:
    a creating circuit which creates a pseudo-random number; and
    a logic gate which calculates an exclusive OR of the pseudo-random number and each bit of multi-bit data which is to be written collectively in the memory cells connected to a same word line, the calculation result performed by the logic gate being written in the memory cells.

* * * * *